(12) United States Patent
Mukai et al.

(10) Patent No.: US 6,507,042 B1
(45) Date of Patent: Jan. 14, 2003

(54) SEMICONDUCTOR DEVICE AND METHOD OF MANUFACTURING THE SAME

(75) Inventors: Kohki Mukai, Kanagawa (JP); Hiroshi Ishikawa, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/469,237

(22) Filed: Dec. 22, 1999

(30) Foreign Application Priority Data

Dec. 25, 1998 (JP) .......................... 10-370631
Dec. 25, 1998 (JP) .......................... 10-371061
Dec. 28, 1998 (JP) .......................... 10-372196

(51) Int. Cl.$^7$ ...................... H01L 29/06; H01L 31/0328
(52) U.S. Cl. ................................................. 257/14
(58) Field of Search ......................................... 257/14

(56) References Cited

U.S. PATENT DOCUMENTS

| | | |
|---|---|---|
| 5,313,484 A | 5/1994 | Arimoto |
| 5,656,821 A | 8/1997 | Sakuma |
| 6,821,519 * | 8/2001 | Sugiyama et al. |
| 6,294,794 B1 * | 9/2001 | Yoshimura |

OTHER PUBLICATIONS

Shunichi Muto; *On a Possibility of Wavelength–Domain–Multiplication Memory Using Quantum Boxes*; Jpn. J. Appl. Phys. vol. 34 (1995) Part 2 No. 2B; Feb. 15, 1995; pp. L210–L212.

Istvàn Daruka, et al.; *Dislocation–Free Island Formation in Heteroepitaxial Growth: A Study at Equilibrium*; Physical Review Letters; vol. 79, No. 19; Nov. 10, 1997; pp. 3708–3711.

* cited by examiner

*Primary Examiner*—Stephen D. Meier
(74) *Attorney, Agent, or Firm*—Armstrong, Westerman & Hattori, LLP

(57) ABSTRACT

The present invention relates to a semiconductor device with quantum dots and a method of manufacturing the same, and a structure of the semiconductor device which can control an emission wavelength of the quantum dots and a method of manufacturing the same are provided. The semiconductor device comprises a compound semiconductor substrate containing at least three elements, and quantum dots which are formed on the compound semiconductor substrate and whose emission wavelength is adjusted by the lattice constant of the compound semiconductor substrate.

30 Claims, 27 Drawing Sheets

Low Temperature

High Temperature

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, a semiconductor device having quantum dots and a method of manufacturing the same.

2. Description of the Prior Art

With the progress of semiconductor process, the film forming technology and the fine pattern technology in nano scale are going to be employed to form the semiconductor device. As such film forming technology and such fine pattern technology make progress, the integration density of the semiconductor integrated circuit can be improved and also the devices utilizing the quantum-mechanical effect, e.g., HBT (Hetero Bipolar Transistor) the quantum well laser, etc. are put to practical use. In addition, of next generation devices which employ new material are studied in recent years. For example, the quantum dot memory which employs the hole burning effect has been proposed, in Shunichi Muto, Jpn. J. Appl. Phys. Vol.34 (1995) pp. L210–L212.

In recent years, the quantum dot is observed with interest as ultimate structure utilizing the quantum-mechanical effect. The quantum dot is.an extremely fine potential box in which quantum confinement of the carriers occurs three-dimensionally. The quantum dot has the state density like a delta function. And, only two carries enter into the ground level of one quantum dot.

As one of the devices utilizing such characteristic of the quantum dot, it is proposed to employ the quantum dot in the active region of the semiconductor laser.

In the semiconductor laser having the quantum well structure, the limits of improvement of the oscillation threshold current and the temperature characteristic of the threshold current are pointed out. However, efficiency in mutual action between the electron/hole and the light can be increased up to the utmost limits by applying the quantum dot to the active layer, and thus the oscillation threshold current and the temperature characteristic of the threshold current can be improved.

In addition, the blue chirp modulator, the wavelength converting device, the single electron transistor, or the quantum dot memory utilizing the hole burning effect has been proposed. The formation of next generation devices by utilizing the quantum dot are studied energetically.

As the technology for forming such quantum dot, the fine pattern technology is employed. For example, the lithography method using the electron beam, the forming method on the bottom of the tetrahedral hole, the method of utilizing the lateral growth on the finely inclined substrate, or the atomic manipulation method utilizing the STM (Scanning Tunneling Microscope) technology has been proposed. The structure of the quantum dot formed at a vertex of the pyramidal crystal is written in U.S. Pat. No. 5,313,484, and the method of forming the quantum dot on the inner surface of the tetrahedral hole is written in U.S. Pat. No. 5,656,821.

Since those methods have a common feature to work artificially, they have such an advantage that the quantum dot position can be controlled arbitrarily. However, the number density of the quantum dots cannot exceed the accuracy limit of the fine pattern technology and also the uniformity of the quantum dots is extremely low.

As the new technology serving as the break-through to form the quantum dot, the technology for self-forming the quantum dot has been found recently. This technology utilizes the phenomenon that the three-dimensional fine structure (quantum dot) can be self-formed by vapor-epitaxial-growing the semiconductor having the lattice mismatching under certain conditions. This method is extremely easy to perform rather than the fine patterning. In addition, the resultant quantum dots can have the very high uniformity beyond the accuracy limit of the artificial work technology, and have the high number density and the high quality.

Such technology is described in Istavan Daruka et al., PHYSICAL REVIEW LETTERS, Vol.79, No.19, Nov. 10, 1997. Devices such as the semiconductor laser, for example, using such self-formed quantum dot are actually reported and a possibility of the quantum dot device becomes practical.

Several forming modes in the self-formation of the quantum dot have been known. The best-known forming mode is a mode called the Stranski-Krastanov mode (referred to as an "S-K mode" hereinafter). In this mode, the semiconductor crystal which is epitaxially grown is grown two-dimensionally at the beginning of the growth but grown three-dimensionally at the stage beyond the elastic limit of the film. This mode can be most easily achieved in the self-forming modes and thus employed normally. According to this mode, the quantum dots can be formed at the high number density.

FIG. 1 shows the situation that InAs dots 102 which are self-formed on a GaAs substrate 101 are covered with a GaAs layer 103.

In addition, a mode called the Volmer-Webber mode is known as another mode. In this mode, the semiconductor crystal is grown three-dimensionally from the beginning without the initial two-dimensional growth. It is said that normally this mode occurs at the lower temperature than the S-K mode. However, it is hard to form the dots with high quality and therefore the study of this mode is not actually conducted.

Furthermore, as the new dot forming method utilizing the self-forming mode, a closely stacking method attracts the skilled person's attention. The closely stacking method is such a method that the big height quantum dots can be formed by laminating the three-dimensional structures, which are formed by the already-mentioned method, via the intermediate layer having a small thickness, through which the carriers are tunneled, along the growing direction to be put together as a lump respectively. According to this method, the quantum dots with the high uniformity can be formed.

In this manner, various methods have been found for the technology for forming the quantum dots. However, if the application of the quantum dot to the devices is considered, it is indispensable to control the energy of the quantum dots.

For example, if the case where the semiconductor laser using the quantum dots is applied to the laser light source for the optical communication is considered, the semiconductor laser whose emission wavelength is 1.3 $\mu$m (0.95 eV) or 1.55 $\mu$m (0.8 eV) must be formed. However, if the InAs or InGaAs quantum dots are formed on the GaAs substrate, the bandgap energy is about 1.1 to 1.3 eV. As a result, it is impossible to employ such quantum dots in the optical communication.

Moreover, in the case of the quantum dots formed by the closely stacking method, similarly the bandgap energy is about 1.1 to 1.3 eV if the InAs or InGaAs quantum dots are formed on the GaAs substrate, like the case of the single S-K mode. As a result, it is impossible to employ such quantum dots in the optical communication.

Still other subjects for the practical use of the device become apparent. There are the temperature dependency of the quantum dot energy as one of such subjects. Normally, the energy is reduced when the temperature is increased, and such temperature change affects the device characteristic. For example, if the low temperature state shown in FIG. 2A and the high temperature state shown in FIG. 2B are compared with each other, the crystal lattice strains between the quantum dots 2 and peripheral crystals 1, 3 become different.

The reason for the temperature change of the energy is intrinsic. This is because the lattice constant of the semiconductor crystal depends on the temperature and thus the bandgap is changed according to the change of the lattice constant.

That is, such phenomenon occurs in not only the quantum dot but also the quantum well. In order to overcome such phenomenon, search of new material system is carried on, but such search has not come up to the success yet.

SUMMARY OF THE INVENTION

It is an object of the present invention to provide a semiconductor device in which an emission wavelength of quantum dot can be controlled and a method of manufacturing the same.

It is another object of the present invention to provide a semiconductor device having a structure in which energy of the quantum dot is difficult to be affected by the temperature change.

According to the present invention, the quantum dots are formed on the compound semiconductor substrate by controlling the composition of the compound semiconductor substrate which contains at least three elements. Therefore, the emission wavelength of the quantum dots can be adjusted by the lattice constant of the compound semiconductor substrate. As a result, the emission wavelength of the quantum dots can be shifted to the longer wavelength side, and also the quantum dots having the emission wavelength of 1.3 $\mu$m band or 1.55 $\mu$m band, which is difficult to accomplish by the quantum dots formed on the GaAs substrate in the prior art, can be formed.

Further, according to the present invention, the buffer layer whose lattice constant in the neighborhood of the surface is different from the lattice constant in the neighborhood of the interface between the buffer layer and the semiconductor substrate is formed on the semiconductor substrate, and then the quantum dots are formed on the buffer layer. Therefore, the emission wavelength of the quantum dots can be adjusted by the lattice constant in the neighborhood of the surface of the buffer layer. As a result, the emission wavelength of the quantum dots can be shifted to the longer wavelength side, and also the quantum dots having the emission wavelength in the 1.3 $\mu$m band or the 1.55 $\mu$m band, which is difficult to be achieved by the quantum dots formed on the GaAs substrate in the prior art, can be formed.

Furthermore, according to the present invention, since lattice strains of the quantum dots and the second semiconductor crystal layer covering the quantum dots can be relaxed by covering a part of the quantum dots with the first semiconductor crystal layer, influence of the lattice distortion upon the original energy of the quantum dots can be reduced. Therefore, an amount of change in the lattice distortion energy of the quantum dots due to the temperature change can be reduced. As a result, an amount of change in the total energy of the quantum dots can be suppressed rather than the prior art.

This is because change in the total energy of the quantum dots due to the temperature change becomes equal to a sum of the energy change as a bulk and the energy change due to the lattice distortion at a rough estimate.

DESCRIPTION OF THE PREFERRED EMBODIMENTS

Figure 1:
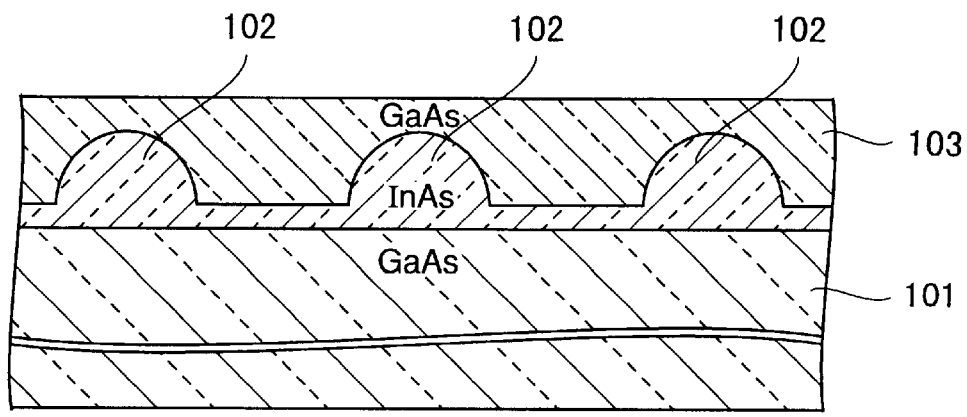
FIG. 1 is a sectional view showing a quantum dot structure device in the prior art.

Embodiments of the present invention will be explained in detail with reference to the accompanying drawings hereinafter.

To begin with, the principle of first to sixth embodiments of the present invention will be explained hereinbelow.

According to the semiconductor device manufacturing method in the prior art, the quantum dots formed of InAs are self-formed on the GaAs buffer layer by forming the GaAs buffer layer on the GaAs substrate and the(n supplying InAs equivalent to several atomic layers. If the InAs equivalent to several atomic layers is supplied onto the GaAs buffer layer, since the lattice constants between InAs and GaAs are different, the InAs can be stabilized in energy in the case where InAs or InGaAs which is formed by fetching Ga from the GaAs substrate are aggregated as a lump rather than the thin InAs is spread uniformly over the GaAs buffer layer. Therefore, the quantum dots formed of InAs are formed on the GaAs buffer layer.

In this case, in order to get the quantum dots which have the longer emission wavelength, it is effective to increase a size of the quantum dot by adjusting the growth conditions or to increase effectively a size of the quantum dot by laminating the quantum dots in close proximity. In contrast, there is such a possibility that, since the increase in the size of the quantum dot makes narrow the distance between energy levels, such increase in the size departs from the original intention of the quantum dots to improved the performance of the laser or the nonlinear device by concentrating the carriers to the ground level. Therefore, if the quantum dots are formed by the semiconductor device manufacturing method in the prior art, the control of the emission wavelength is limited within the range of about 1.1 to 1.2 $\mu$m at a room temperature.

As the result of inventor's earnest study of the present invention under such circumstance, it can be made clear for the first time that a size and composition of the quantum dots can be decided based on difference in the surface energy due to the lattice mismatching between the underlying layer and the quantum dot and thus the emission wavelength of the quantum dots (energy bandgap) can be controlled by controlling an amount of the lattice mismatching between the underlying layer and the quantum dot layer.

An amount of the lattice mismatching can be controlled by the composition of the semiconductor substrate. For example, if the ternary system InGaAs substrate formed of mixed crystal of InAs and GaAs is employed in place of the GaAs substrate as the semiconductor substrate, such amount of the lattice mismatching can be varied by controlling the In composition of the substrate.

If the underlying substrate is changed from the GaAs substrate to the InGaAs substrate, it may be guessed that difference between the lattice constant of the InGaAs substrate and the original lattice constant of the quantum dots becomes substantially equal to difference between the lattice constants when the quantum dots are formed on the GaAs substrate. Accordingly, it can be expected that the emission wavelength cain be shifted to the longer wavelength side by forming the quantum dots on the InGaAs substrate rather than the case where the quantum dots are formed on the GaAs substrate. Also, it can be expected that the emission wavelength can be shifted much more to the longer wavelength side as the In composition is increased.

If the quantum dots are formed in the S-K mode on the GaAs substrate, the resultant emission wavelength of the quantum dots is almost 1.1 $\mu$m. Therefore, the emission wavelength becomes about 1.3 $\mu$m by setting the In composition of the substrate to about 0.05 to 0.2. Also, it may be considered that, if the In composition is further increased, the light emission in the 1.55 $\mu$m band can be achieved.

Figure 3:
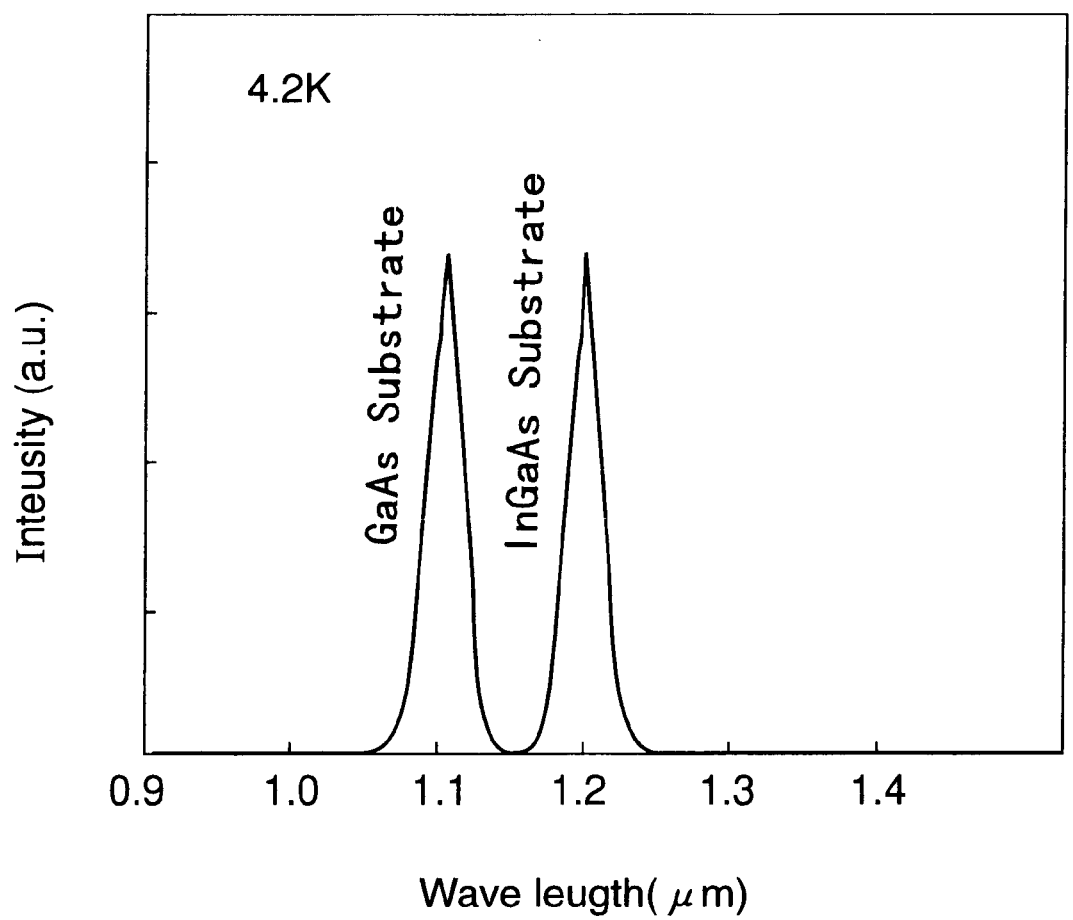
FIG. 3 is a graph showing a PL emission spectrum when quantum dots are formed on an InGaAs substrate and quantum dots are formed on a GaAs substrate.

FIG. 3 is a graph showing a PL emission spectrum at 4.2 K when the quantum dots are formed on the $In_{0.2}Ga_{0.8}As$ substrate and when the quantum dots are formed on the GaAs substrate. As illustrated in FIG. 3, the sample using the $In_{0.2}Ga_{0.8}As$ substrate can emits the light at 1.2 $\mu$m which is longer by 0.1 $\mu$m than about 1.1 $\mu$m which is obtained by using the GaAs substrate. In this case, the emission wavelength of this sample was about 1.3 $\mu$m at room temperature. In this fashion, it can be found that the emission wavelength of the quantum dots can be shifted to the longer wavelength by using the InGaAs substrate as the substrate rather than the case where the GaAs substrate is employed.

Embodiments of the present invention will be explained in detail with reference to the accompanying drawings hereinafter.

First Embodiment

A semiconductor device and a method of manufacturing the same according to a first embodiment of the present invention will be explained with reference to FIGS. 4 and 5A to 5C hereinbelow.

Figure 4:
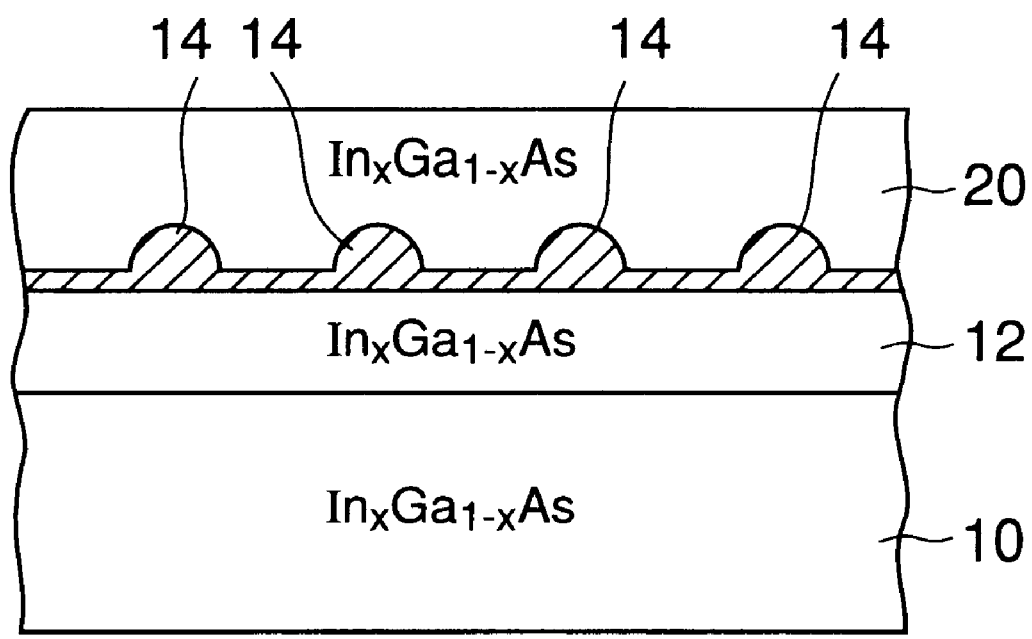
FIG. 4 is a schematic sectional view showing a structure of a semiconductor device according to a first embodiment of the present invention.
Figure 5A:
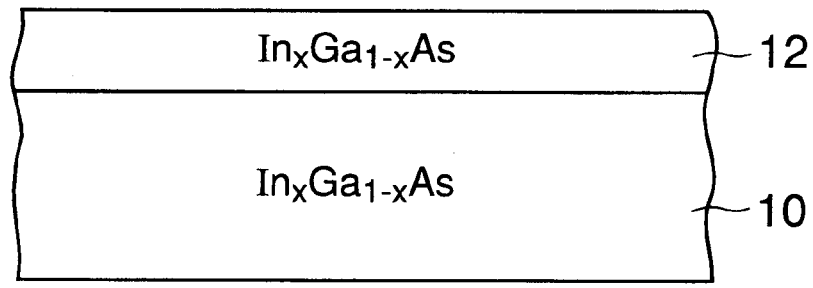
FIGS. 5A to 5C are sectional views showing steps of a semiconductor device manufacturing method according to the first embodiment of the present invention.
Figure 5B:
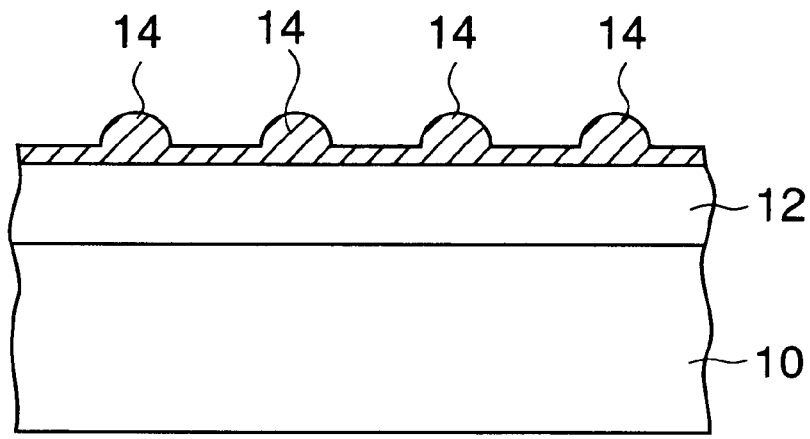
Figure 5C:
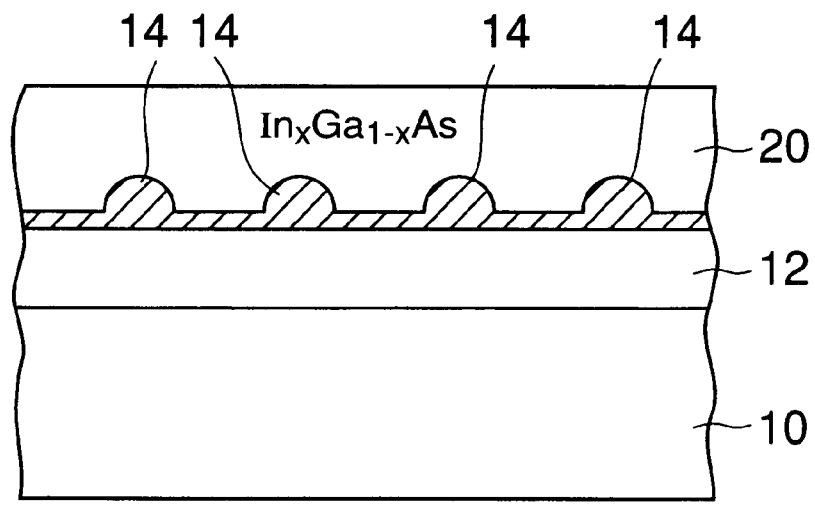

FIG. 4 is a schematic sectional view showing a structure of a semiconductor device according to the first embodiment. FIGS. 5A to 5C are sectional views showing steps of a semiconductor device manufacturing method according to the first embodiment.

First of all, the structure of the semiconductor device according to the first embodiment will be explained with reference to FIG. 4 hereunder.

A buffer layer 12 formed of InGaAs whose lattice constant coincides with that of a substrate is formed on an InGaAs substrate 10. Quantum dots 14 formed of InAs are formed on the buffer layer 12. A cladding layer 20 formed of InGaAs is formed on the quantum dots 14.

Since the InGaAs substrate 10 is used as the substrate and the quantum dots are formed thereon in this manner, the emission wavelength of the quantum dots can be set as a longer wavelength than the case where the quantum dots, are formed on a GaAs substrate. More particularly, the emission wavelength of the quantum dots is about 1.1 μm if the quantum dots are formed on the GaAs substrate, nevertheless the emission wavelength of the quantum dots 14 can be controlled into about 1.3 μm because In composition of the quantum dots 14 can be shifted by setting the In composition of the InGaAs substrate 10 and the InGaAs buffer layer 12 to about 0.1 to 0.2. Also, the emission wavelength of the quantum dots 14 can be controlled into about 1.55 μm by setting the In composition of the InGaAs substrate 10 and the InGaAs buffer layer 12 to about 0.25 to 0.3.

Next, the semiconductor device manufacturing method according to the first embodiment of the present invention will be explained with reference to FIGS. 5A to 5C hereunder.

First, as shown in FIG. 5A, the buffer layer 12 made of InGaAs is formed on the InGaAs substrate 10 by the MOVPE method, for example, to have a film thickness of 100 nm. The substrate temperature is set to 630° C., for example, and the In composition of the InGaAs substrate 10 is set to 0.05 to 0.2, for example. Also, the In composition of the InGaAs buffer layer 12 is set to 0.05 to 0.2 which is the same as the In composition of the InGaAs substrate 10.

Then, as shown in FIG. 5B, the quantum dots 14 formed of InAs are formed on the InGaAs buffer layer 12 by the MOVPE method, for example. The quantum dots 14 are self-formed in the S-K mode by supplying InAs, which is equivalent to about two atomic layers, while setting the substrate temperature to 500° C., for example.

Then, as shown in FIG. 5C, the cladding layer 20 formed of InGaAs is formed by the MOVPE method, for example, to have a film thickness of about 100 nm. The substrate temperature is set to 630° C., for example, and the In composition of the cladding layer 20 is set to 0.05 to 0.2 which is the same as, the In composition of the InGaAs substrate 10.

In this manner, because the quantum dots 14 are formed on the InGaAs substrate 10, the quantum dots 14 having the emission wavelength of 1.3 μm can be formed when the In composition of the substrate is set to about 0.1 to 0.2, while the quantum dots 14 having the emission wavelength of 1.55 μm can be formed when the In composition of the substrate is set to about 0.3.

According to the first embodiment, since the quantum dots 14 are formed on the InGaAs substrate 10, the emission wavelength of the quantum dots can be shifted to the longer wavelength side than the case where the quantum dots are formed on the GaAs substrate.

Second Embodiment

A semiconductor device and a method of manufacturing the same according to a second embodiment of the present invention will be explained with reference to FIG. 6 hereinbelow.

Figure 6:
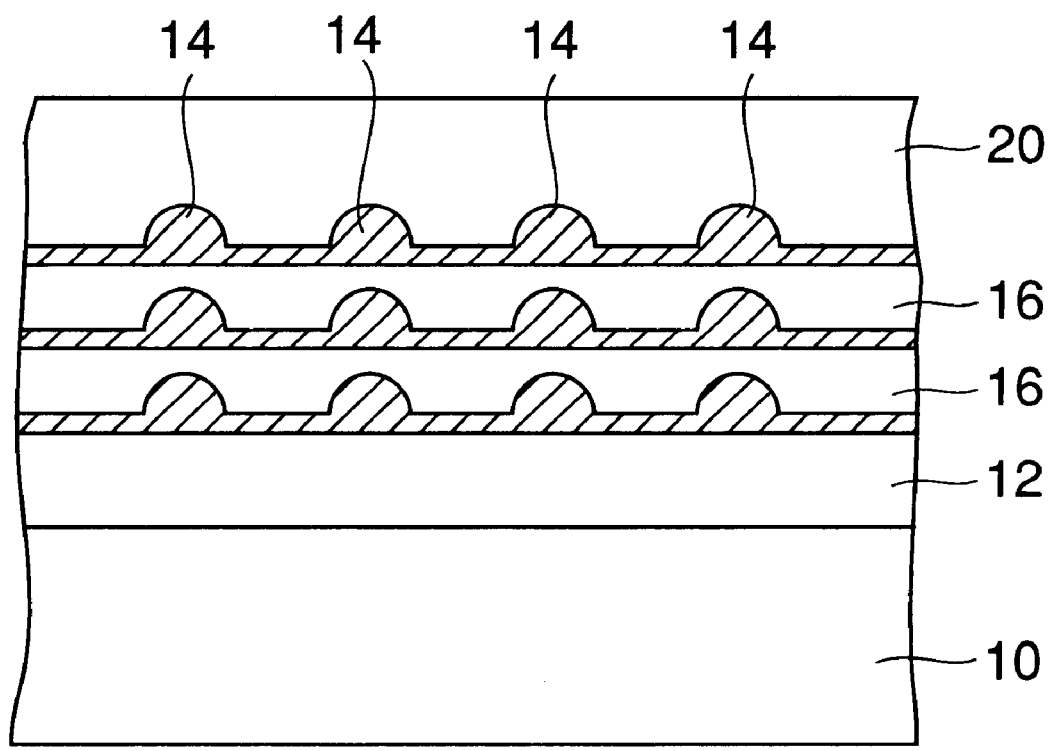
FIG. 6 is a schematic sectional view showing a structure of a semiconductor device and a method of manufacturing the same according to a second embodiment of the present invention.

As shown in FIG. 6, the semiconductor device according to the second embodiment has such a feature that, in the semiconductor device according to the first embodiment, the quantum dots 14 are formed as a multi-layered structure via an InGaAs intermediate layer 16 on the InGaAs buffer layer 12.

The in-plane density of the quantum dots 14 can be extremely increased by forming the semiconductor device in this manner. Hence, the oscillation efficiency can be increased by applying such structure to an active layer of a semiconductor laser, for example.

In this case, in order to manufacture the semiconductor device shown in FIG. 6, in the manufacturing method according to the first embodiment shown in FIG. 5, the multi-layered structure consisting of the quantum dots 14 and the intermediate layer 16 may be formed by forming the buffer layer 12 and then depositing alternatively the InAs quantum dots 14 being equivalent to about two atomic layers and the InGaAs intermediate layer 16 being equivalent to the film thickness of about 20 nm.

In this way, according to the second embodiment, since the quantum dots 14 are formed on the InGaAs substrate 10 as the multi-layered structure, the in-plane density of the quantum dots 14 can be increased. As a result, the oscillation efficiency can be increased by applying such quantum dots to the semiconductor laser, for example.

Third Embodiment

A semiconductor device and a method of manufacturing the same according to a third embodiment of the present invention will be explained with reference to FIGS. 7 and 8A to 8C hereinbelow.

Figure 7:
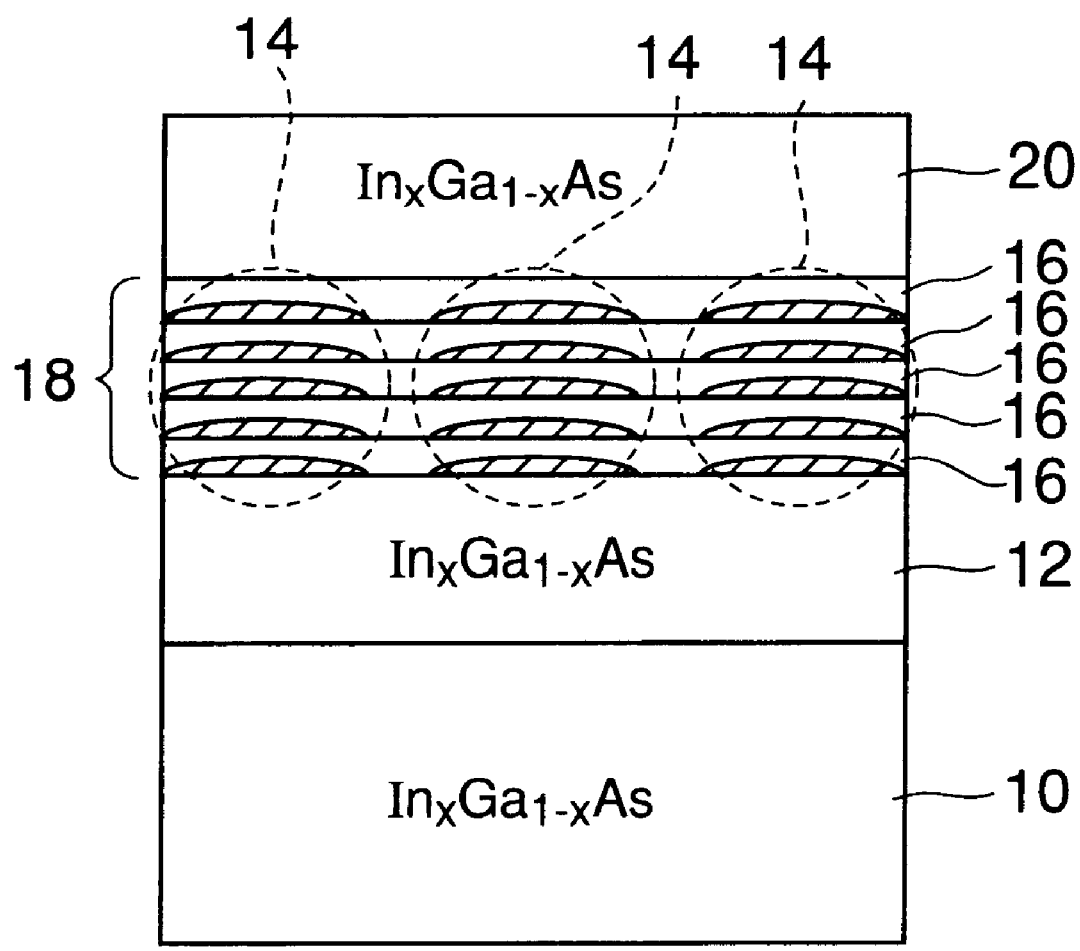
FIG. 7 is a schematic sectional view showing a structure of a semiconductor device according to a third embodiment of the present invention.
Figure 8A:
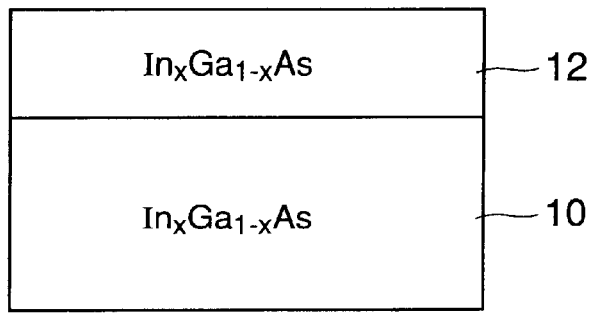
FIGS. 8A to 8C are sectional views showing steps of a semiconductor device manufacturing method according to the third embodiment of the present invention.
Figure 8B:
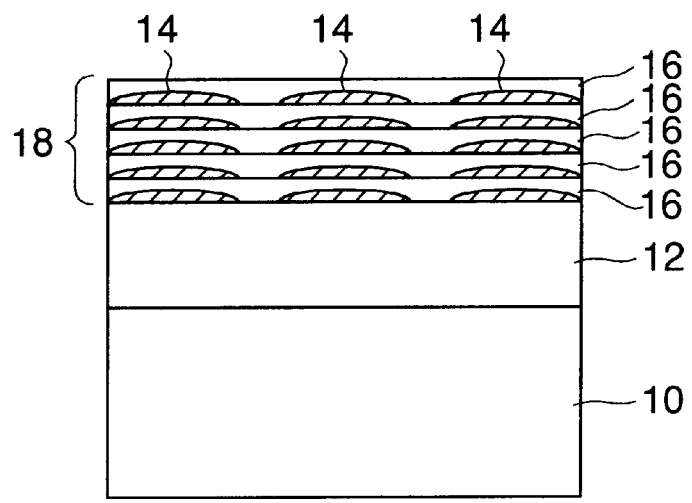
Figure 8C:
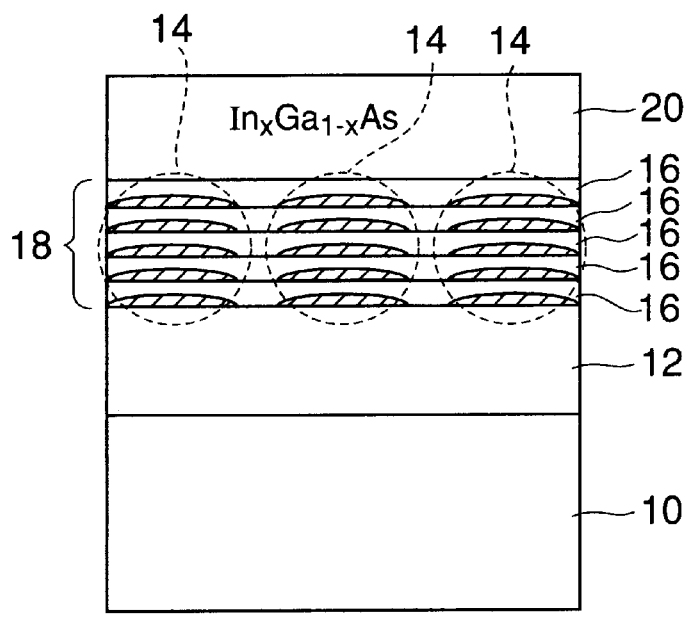

FIG. 7 is a schematic sectional view showing a structure of a semiconductor device according to the third embodiment. FIGS. 8A to 8C are sectional views showing steps of a semiconductor device manufacturing method according to the third embodiment.

As shown in FIG. 7, the semiconductor device according to the third embodiment has such a structure that, in the semiconductor device according to the second embodiment, the quantum dots 14 are formed as the multi-layered structure, whose layers are laminated in close vicinity respectively, to act as one quantum dot. More particularly, if a film thickness of the intermediate layer 16 is reduced to such an extent that it becomes thinner than a height of the quantum dot 14, a plurality of quantum dots 14 which are laminated in close proximity in the film forming direction can begin to function as one quantum dot. That is, an effective size of the quantum dot 14 can be increased. Accordingly, a quantum size effect is weakened and thus the emission wavelength is shifted to the longer wavelength side. As a result, since the quantum dots 14 are laminated in close proximity in addition to a synergistic effect obtained by using the InGaAs substrate 10, the emission wavelength can be further shifted to the longer wavelength side.

When the quantum dots 14 are formed on the GaAs substrate to be laminated in close proximity, the emission wavelength of the quantum dots becomes about 1.2 μm. However, the emission wavelength of the quantum dots 14 can be controlled to about 1.3 μm by setting the In composition of the InGaAs substrate 10 and the InGaAs buffer layer 12 to about 0.1 to 0.2. Similarly, the emission wavelength of the quantum dots 14 can be controlled to about 1.55 μm by setting the In composition of the InGaAs substrate 10 and the InGaAs buffer layer 12 to about 0.3.

Next, the semiconductor device manufacturing method according to the third embodiment of the present invention will be explained with reference to FIGS. 8A to 8C hereunder.

First, as shown in FIG. 8A, the buffer layer 12 made of InGaAs is formed on the InGaAs substrate 10 by the MOVE method, for example, to have a film thickness of about 300 nm. The substrate temperature is set to 630° C., for example, and the In composition of the InGaAs substrate 10 and the InGaAs buffer layer 12 is set to 0.05 to 0.2, for example.

Then, as shown in FIG. 8B, the quantum dots 14 whose layers are laminated in close proximity are formed on the InGaAs buffer layer 12 by the MOVPE method, for example. The InAs quantum dots 14 and the InGaAs intermediate layers 16 are formed alternatively in the S-K mode by depositing alternatively InAs, which is equivalent to about two atomic layers, and InGaAs, which is equivalent to a film thickness of about 3 nm, while setting the substrate temperature to 500° C., for example. Accordingly, a quantum dot layer 18 in which The InAs quantum dots 14 and the InGaAs intermediate layers 16 are laminated in close proximity is formed. The In composition of the InGaAs intermediate layers 16 is set to 0.1 to 0.25, for example.

Then, as shown in FIG. 8C, the cladding layer 20 formed of InGaAs is formed on the quantum dot layer 18 by the MOVPE method, for example. The substrate temperature is set to 630° C., for example, and the In composition of the cladding layer 20 is set to 0.05 to 0.2 which is the same as the In composition of the InGaAs substrate 10.

In this manner, because the quantum dots 14 which are laminated in close proximity are formed on the InGaAs substrate 10, the quantum dots having the emission wavelength of 1.3 μm can be formed when the In composition of the substrate is set to about 0.1 to 0.15, while the quantum dots having the emission wavelength of 1.55 μm can be formed when the In composition of the substrate is set to about 0.25.

According to the first embodiment, since the quantum dots 14 are laminated in close proximity on the InGaAs substrate 10, the effective size of the quantum dots 14 can be increased. As a result, the emission wavelength of the quantum dots can be further shifted to the longer wavelength side.

Fourth Embodiment

A semiconductor device and a method of manufacturing the same according to a fourth embodiment of the present invention will be explained with reference to FIGS. 9 and 10A to 10C hereinbelow.

Figure 9:
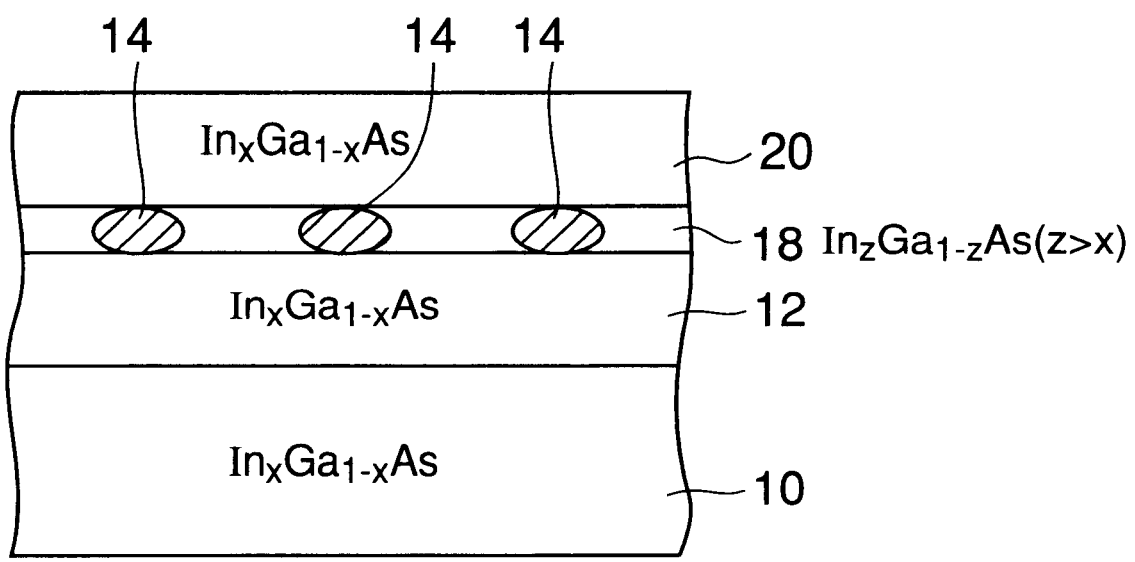
FIG. 9 is a schematic sectional view showing a structure of a semiconductor device according to a fourth embodiment of the present invention.
Figure 10A:
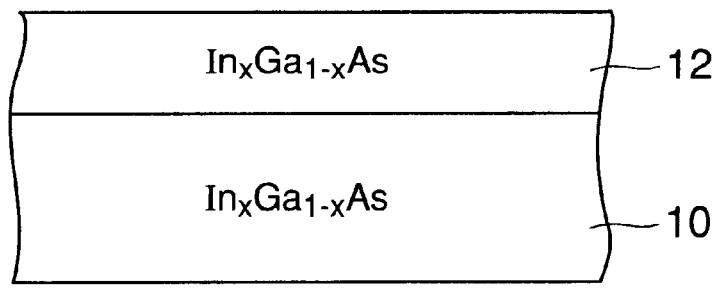
FIGS. 10A to 10C are sectional views showing steps of a semiconductor device manufacturing method according to the fourth embodiment of the present invention.
Figure 10B:
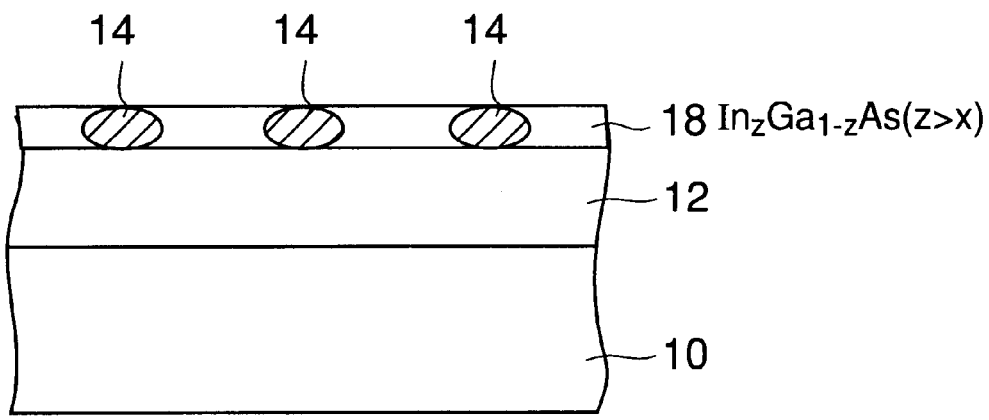
Figure 10C:
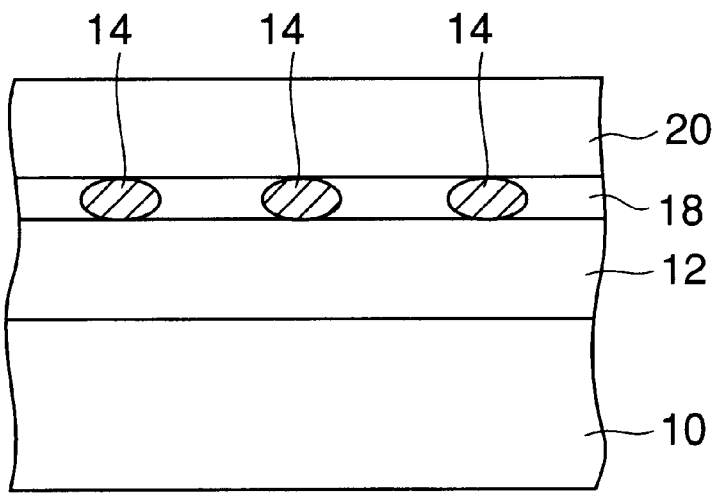

FIG. 9 is a schematic sectional view showing a structure of a semiconductor device according to the fourth embodiment. FIGS. 10A to 10C are sectional views showing steps of a semiconductor device manufacturing method according to the fourth embodiment.

First of all, a structure of a semiconductor device according to the fourth embodiment will be explained with reference to FIG. 9 hereunder.

The InGaAs buffer layer 12 is formed on the InGaAs substrate 10. An InGaAs quantum dot layer 18 which contains the quantum dots 14 therein is formed on the buffer layer 12. The InGaAs cladding layer 20 is formed on the quantum dot layer 18.

Here the semiconductor device according to the fourth embodiment has such a feature that the quantum dot layer 18 is formed by the atomic layer growing approach which supplies InAs and GaAs alternatively. This approach makes it possible to form the dots which have relatively high In composition in InGaAs, and is one of effective approaches which can shift the emission wavelength of the quantum dots to the longer wavelength side.

Next, the semiconductor device manufacturing method according to the fourth embodiment of the present invention will be explained with reference to FIGS. 10A to 10C hereunder.

First, as shown in FIG. 10A, the buffer layer 12 made of InGaAs is formed on the InGaAs substrate 10 by the MOVPE method, for example, to have a film thickness of 100 nm. The substrate temperature is set to 630° C., for example, and the In composition of the InGaAs substrate 10 is set to 0.05 to 0.2, for example. Also, the In composition of the InGaAs buffer layer 12 is set to 0.05 to 0.2 which is the same as the In composition of the InGaAs substrate 10.

Then, as shown in FIG. 10B, the quantum dot layer 18 formed of InGaAs are, formed on the InGaAs buffer layer 12 by the MOVPE method, for example. The quantum dot layer 18 if formed by supplying alternatively InAs and GaAs at the atomic layer level to form a film, while setting the substrate temperature to 460° C., for example. When the InGaAs film is formed by supplying alternatively InAs and GaAs, the quantum dots 14 can be formed because InGaAs having higher In composition is aggregated in the film. For instance, the quantum dot layer in which the InGaAs quantum dots each having the In composition of about 0.5 are scattered in the InGaAs layer having the In composition of about 0.2 to 0.3 can be formed.

Then, as shown in FIG. 10C, the cladding layer 20 formed of InGaAs is formed by the MOVPE method, for example, to have a film thickness of about 100 nm. The substrate temperature is set to 600° C., for example, and the In composition of the cladding layer 20 is set to 0.05 to 0.2 which is the same as the In composition of the InGelAs substrate 10.

In this manner, because the quantum dots 14 are formed on the InGaAs substrate 10, the quantum dots 14 having the emission wavelength of 1.3 μm can be formed when the In composition of the substrate is set to about 0.1 to 0.2, while the quantum dots 14 having the emission wavelength of 1.55 μm can be formed when the In composition of the substrate is set to about 0.3.

According to the fourth embodiment, since the quantum dot layer 18 is formed on the InGaAs substrate 10 by the atomic layer growing approach which supplies InAs and GaAs alternatively, the quantum dots which contain a lot of In composition and have the longer emission wavelength can be formed.

Fifth Embodiment

A semiconductor device and a method of manufacturing the same according to a fifth embodiment of the present invention will be explained with reference to FIGS. 11 and 12A to 12D hereinbelow.

Figure 11:
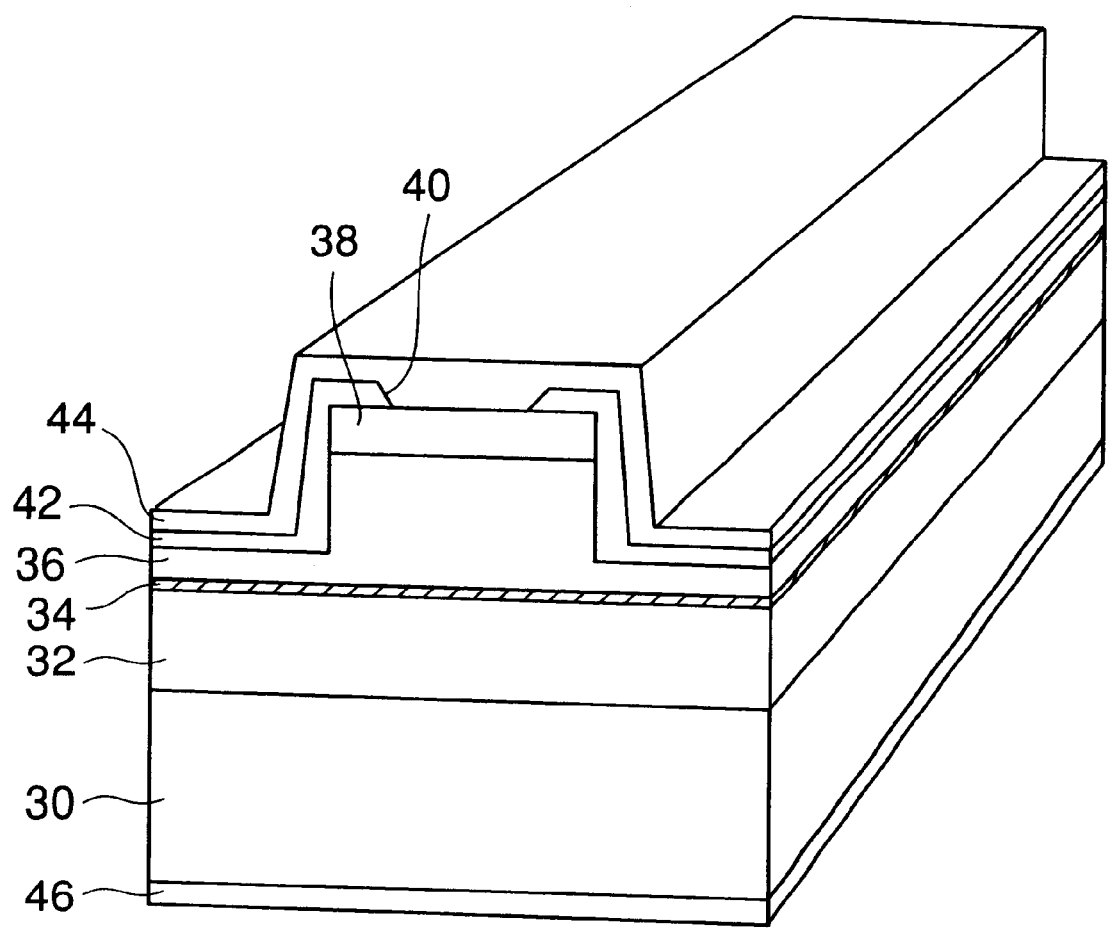
FIG. 11 is a schematic sectional view showing a structure of a semiconductor device according to a fifth embodiment of the present invention.

FIG. 11 is a schematic sectional view showing a structure of a semiconductor device according to the fifth embodiment. FIGS. 12A to 12D are sectional views showing steps of a semiconductor device manufacturing method according to the fifth embodiment.

In the fifth embodiment, the case where the quantum dots constructed by the present invention are applied to a laser device will be explained hereunder.

A cladding layer 32 formed of n-InGaP which has In composition having the same lattice constant as an n-InGaAs substrate 30 is formed on an n-InGaAs substrate 30. A quantum dot layer 34 is formed on the cladding layer 32. The quantum dot layer 34, referred to in the fifth embodiment, corresponds to a laminated film which consists of the buffer layer 12 to the cladding layer 20 in the semiconductor device set forth in any one of the first to fourth embodiments. A cladding layer 36 formed of p-InGaP which has the same composition as n-InGaP constituting the cladding layer 32 is formed on the quantum dot layer 34. A contact layer 38 formed of p-InGaAs is formed on the cladding layer 36. The contact layer 38 and the cladding layer 36 are formed like a stripe shape such that a ridge structure is formed stabilize the lateral mode of the semiconductor laser. A silicon oxide film 42 which has an opening 40 on a top surface of the stripe is formed on the contact layer 38 and the cladding layer 36 both are formed like the stripe shape. A p-type electrode 44 which is connected to the contact layer 38 via the opening 40 is formed on the silicon oxide film 42. Also, an n-type electrode 46 is formed on a back surface of the n-InGaAs substrate 30.

With the above, the semiconductor device according to the fifth embodiment can be completed.

In the semiconductor device according to the fifth embodiment, the laminated film which consists of the buffer layer 12 to the cladding layer 20 in the semiconductor device set forth in any one of the first to fourth embodiments is utilized as the quantum dot layer 34. The optical confinement of the laser in the vertical direction can be achieved by arranging InGaP (the cladding layers 32, 36), which is lattice-matched with the substrate and has the large bandgap, on and under the quantum dot layer 34. When the semiconductor laser is constructed in this way, the quantum dot active layer can emit effectively the light of the wavelength of 1.3 μm and 1.5 μm. As a result, the semiconductor laser with the low threshold current and the high efficiency can be achieved in this wavelength range.

Next, the semiconductor device manufacturing method according to the fifth embodiment of the present invention will be explained with reference to FIGS. 12A to 12D hereunder.

First, as shown in FIG. 5A, the cladding layer 32 made of n-InGaP is formed on the n-InGaAs substrate 30 by the MOVPE method, for example, to have a film thickness of about 300 μm. The In composition of n-InGaP constituting the cladding layer 32 is selected such that the lattice constant of the n-InGaP layer becomes equal to that of the n-InGaAs substrate 30.

Then, like the semiconductor device manufacturing method set forth in any one of the fifth to fourth embodiments, the buffer layer 12, the quantum dots 14 or the quantum dot layer 18, and the cladding layer 20 are formed on the cladding layer 32. Thus, the quantum dot layer 34 consisting of these layers can be formed.

Then, the cladding layer 36 formed of p-InGaP is formed on the quantum dot layer 34 by the MOVPE method, for example, to have a film thickness of about 2.5 μm. The In composition of p-InGaP which constitutes the cladding layer 36 is made equal to the In composition of n-InGaP which constitutes the cladding layer 32.

Figure 12A:
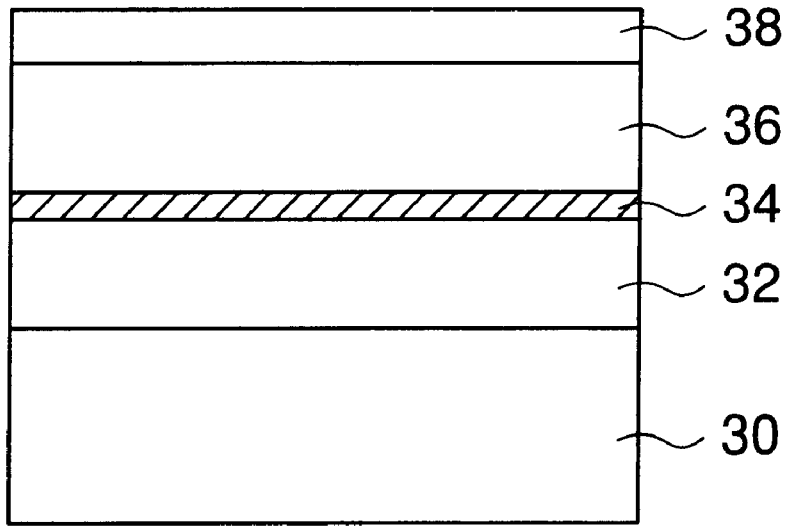
FIGS. 12A to 12D are sectional views showing steps of a semiconductor device manufacturing method according to the fifth embodiment of the present invention.

Then, as shown in FIG. 12A, the contact layer 38 formed of p-InGaAs is formed on the cladding layer 36 by the MOVPE method, for example, to have a film thickness of about 300 nm.

Figure 12B:
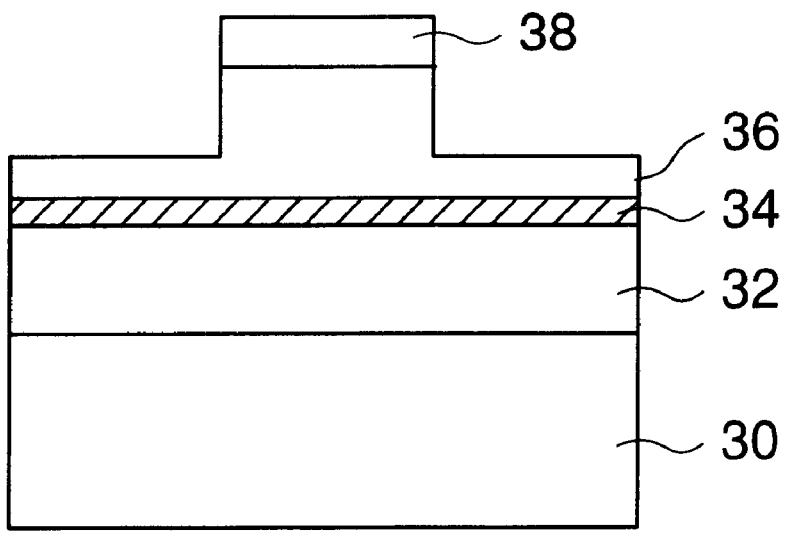

Then, as shown in FIG. 12B, the cladding layer 36 and the contact layer 3B are shaped into a stripe shape such that the cladding layer 36 on the quantum dot layer 34 remains by about 500 nm thick.

Figure 12C:
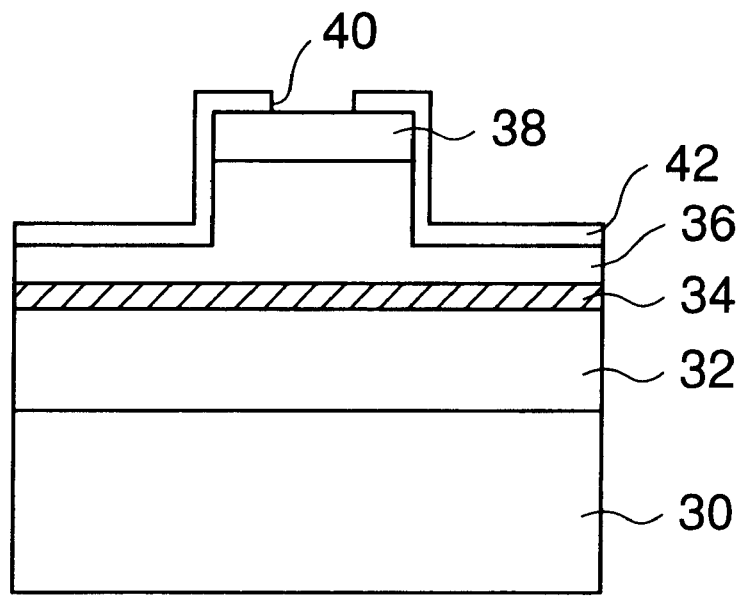

Then, as shown in FIG. 12C, the silicon oxide film 42 which has the stripe-shaped opening 40 in the top surface of the stripe is formed on the stripe-shaped contact layer 38, and the cladding layer 36.

Figure 12D:
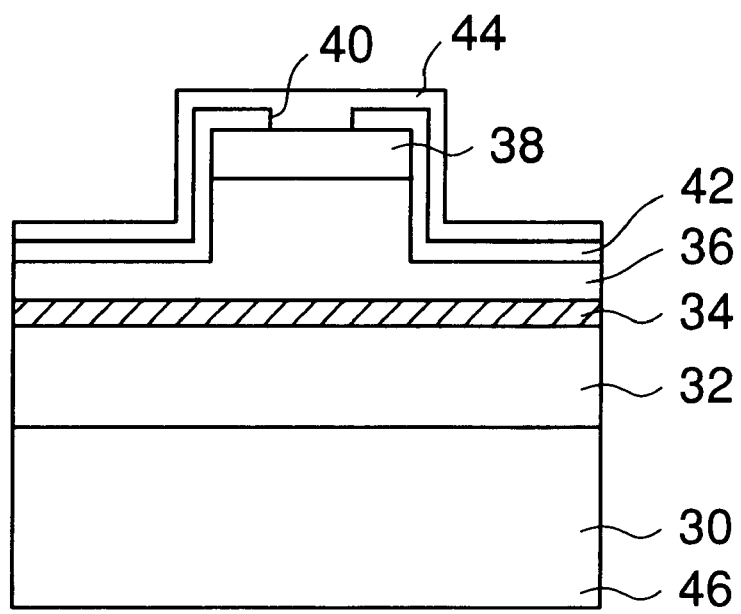

Then, as shown in FIG. 12D, the p-type electrode 44 which is connected to the contact layer 38 via the opening 40 is formed on the silicon oxide film 42. Similarly, the n-type electrode 46 is formed on the back surface of the n-InGaAs substrate 30.

In this manner, according to the fifth embodiment, because the emission wavelength of the quantum dots can be controlled by the lattice constant of the semiconductor substrate in the, semiconductor laser which has the active layer formed of the quantum dot layer, the oscillation threshold current and the temperature characteristic of the threshold current can be improved and also the emission wavelength can be made longer. Accordingly, the semiconductor laser having the emission wavelength of 1.3 μm band or 1.55 μm band, which is suitable for the optical communication, can be constructed.

In the fifth embodiment, the typical Fabry-Perot laser is explained. However, the fifth embodiment may be similarly applied to the surface laser called VCSEL (Vertical Cavity Surface Emitting Laser).

Also, in the fifth embodiment, the InGaP layer is used as the cladding layers 32, 36 which put the quantum dot layer 34 between them. However, if material which has the composition being lattice-matched with the substrate and has the bandgap larger than the largest bandgap layer in the quantum dot layer 34 is used, other material may be utilized. For example, an InGaAlA layer or an InGaAsP layer may be employed in place of the InGaP layer.

Sixth Embodiment

The present invention is not limited to above embodiments, and various modifications can be applied to the present invention.

For example, although the case where the quantum dots are formed on the InGaAs substrate 10 is explained as examples in the above embodiments, the present invention may be similarly applied in other material semiconductor devices. That is, the present invention controls the emission wavelength of the quantum dots by selecting appropriately the lattice constant of the semiconductor substrate, and is not limited to above material systems. For example, not only the InGaAs semiconductor but also InP compound semiconductor or the like may be similarly applied. In this case, the ternary system mixed crystal semiconductor substrate or more are suitable for application of the present invention since their lattice constant can be easily controlled by controlling the composition. In addition, group II–VI or group III–V compound semiconductor such as InAs, InGaAs, and others may be applied as the semiconductor layer constituting the quantum dots.

The gist of the present invention resides in that the in-plane lattice constant of the substrate surface can be appropriately controlled at the stage of forming the quantum dot layer. Thus, the similar advantage can be achieved if not only the lattice constant of the semiconductor substrate is controlled as described above, but also the in-plane lattice constant of the substrate surface is controlled by the strain relaxation buffer layer formed on the semiconductor substrate. For example, if the InGaAs buffer layer is provided on the GaAs substrate and then the lattice constant of the surface region of the InGaAs buffer layer is controlled differently from the lattice constant of GaAs, the similar advantage to the present invention can be achieved.

In the fifth embodiment, the case where the quantum dots constructed by the present invention are applied to the active layer of the semiconductor laser is explained. However, the quantum dots constructed by the present invention may be similarly applied to various devices utilizing the quantum dots, e.g., the blue chirp modulator, the wavelength converting device, the quantum dot memory, etc., The above advantages achieved by the present invention do not depend upon the quantum dot film forming method. Normally, the emission wavelength of the quantum dots is changed depending upon the film forming method. Therefore, it is desired that the quantum dot film forming method and the film forming conditions should be appropriately selected and adjusted according to characteristics such as the desired emission wavelength, etc.

Figure 13:
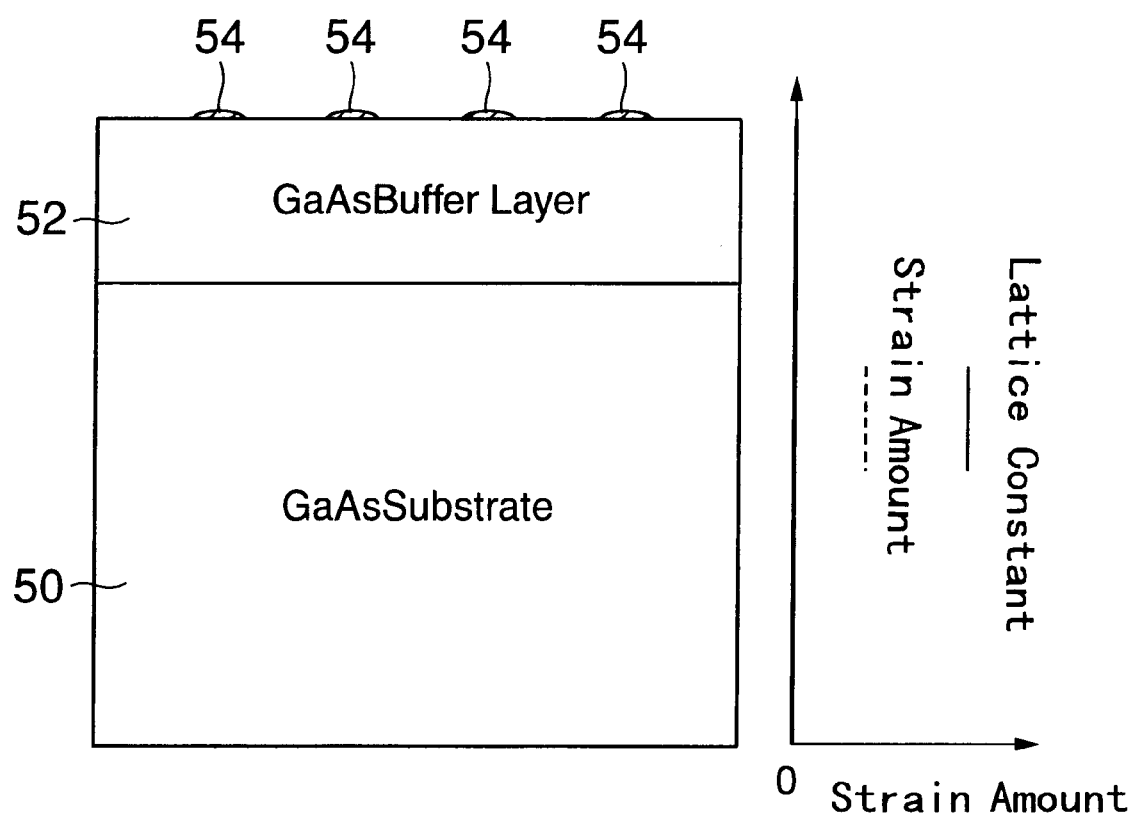
FIG. 13 is a schematic sectional view showing a structure of a semiconductor device and a method of manufacturing the same in the prior art.
Figure 14:
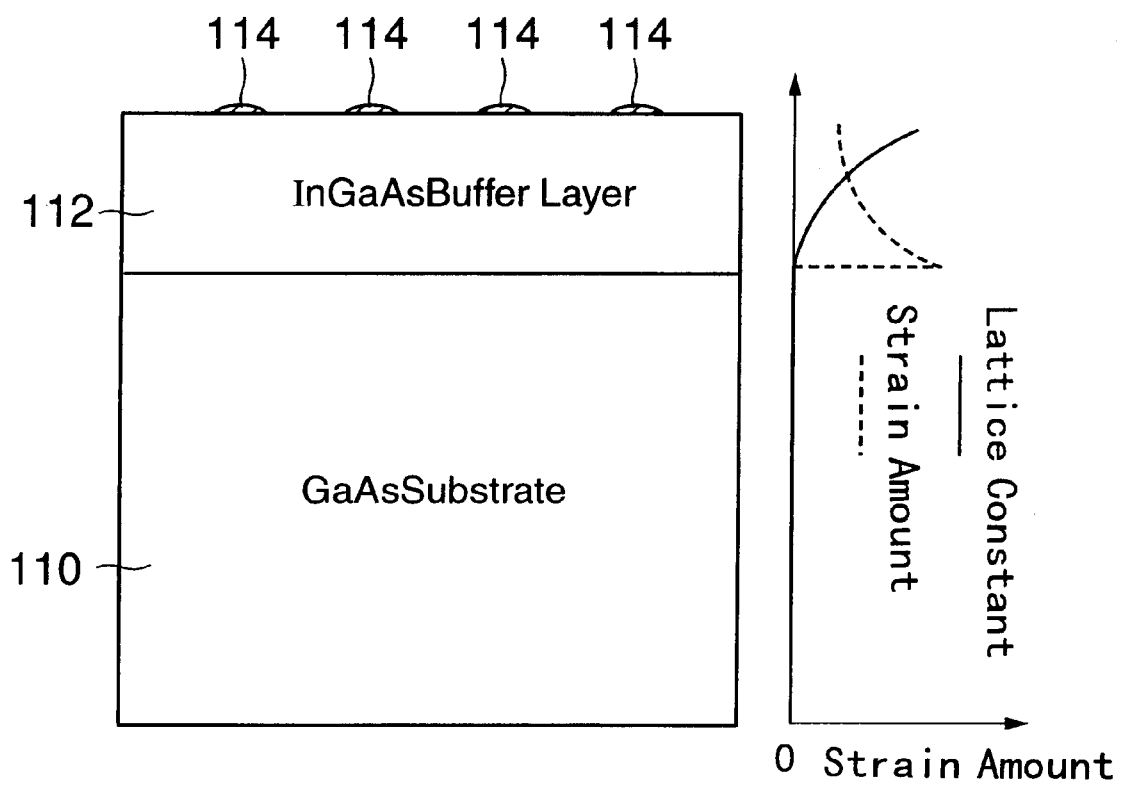
FIG. 14 is a schematic sectional view showing the principle of a semiconductor device according to sixth to ninth embodiments of the present invention.
Figure 15:
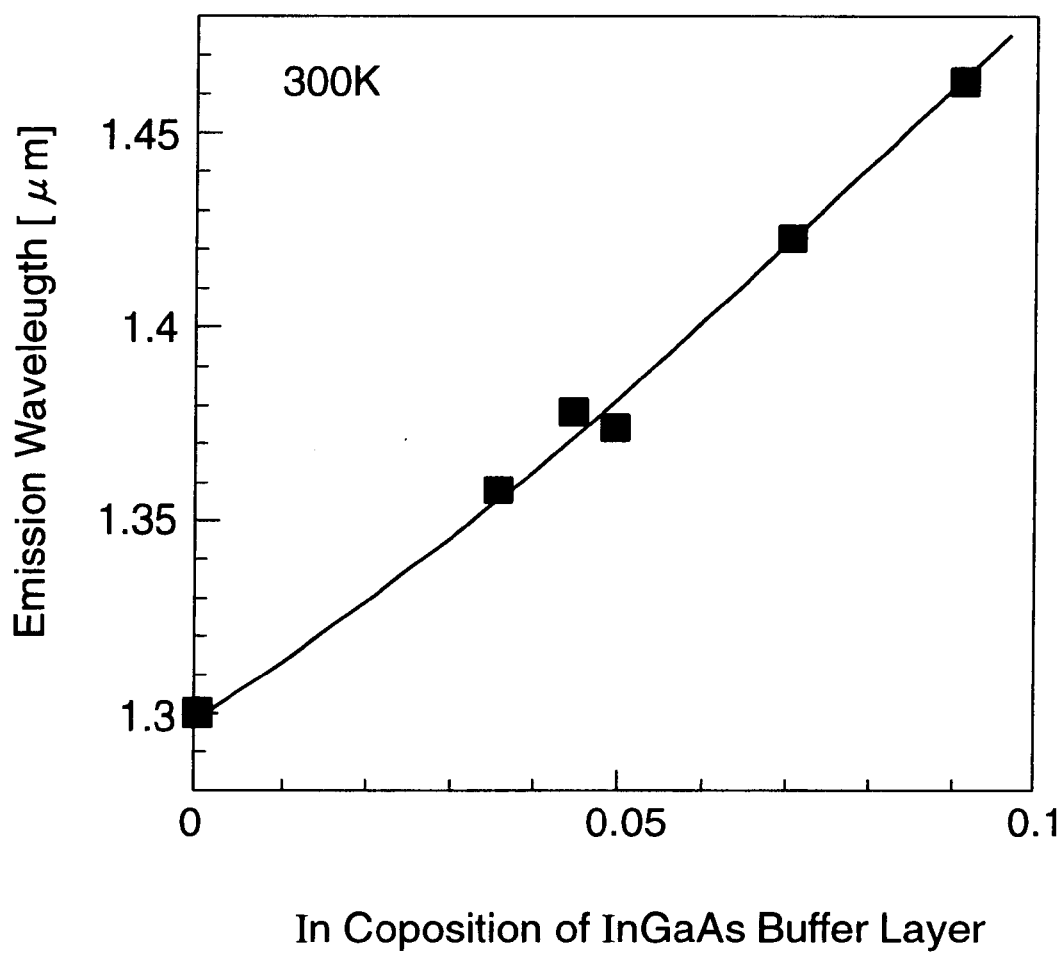
FIG. 15 is a graph showing a relationship between In composition of InGaAs buffer layer and an emission wavelength of a quantum dot in the semiconductor device according to the sixth to ninth embodiments of the present invention.

Next, the principle of seventh to ninth embodiments of the present invention will be explained with reference to FIGS. 13 to 15 hereinbelow. FIG. 13 is a schematic sectional view showing a structure of a semiconductor device and a method of manufacturing the same in the prior art. FIG. 14 is a schematic sectional view showing the principle of a semiconductor device according to sixth to ninth embodiments of the present invention. FIG. 15 is a graph showing a relationship between In composition of InGaAs buffer layer and an emission wavelength of a quantum dot in the semiconductor device according to the sixth to ninth embodiments of the present invention.

In explaining the principle of the present invention, the case where the quantum dots formed of InAs are formed on the GaAs substrate will be mentioned as an example in this disclosure. However, the present invention may be applied similarly if the quantum dots are formed of other material.

According to the semiconductor device manufacturing method in the prior art, as shown in FIG. 15, the quantum dots formed of InAs are self-formed on the GaAs buffer layer by forming the GaAs buffer layer on the GaAs substrate and then supplying InAs equivalent to several atomic layers. If the InAs equivalent to several atomic layers is supplied onto the GaAs buffer layer, since the lattice constants between InAs and GaAs are different, the InAs can be stabilized in energy in the case where InAs or InGaAs which is formed by fetching Ga from the GaAs substrate are aggregated as a lump rather than the thin InAs is spread uniformly over the GaAs buffer layer. Therefore, the quantum dots formed of InAs are formed on the GaAs buffer layer.

In this case, in order to get the quantum dots which have the longer emission wavelength, it is effective to increase a size of the quantum dot by adjusting the growth conditions or to increase effectively a size of the quantum dot by laminating the quantum dots in close proximity. In contrast, there is such a possibility that, since the increase in the size of the quantum dot makes narrow the distance between energy levels, such increase in the size departs from the original intention of the quantum dots to improve the performance of the laser or the nonlinear device by concentrating the carriers to the ground level. Therefore, if the quantum dots are formed by the semiconductor device manufacturing method in the prior art, the control of the emission wavelength is limited within the range of about 1.1 to 1.2 $\mu$m at a room temperature.

As the result of inventor's eager study of the present invention under such circumstance, it can be made clear for the first time that a size and composition of the quantum dots can be decided based on difference in the surface energy due to the lattice mismatching between the underlying layer and the quantum dot layer and thus the emission wavelength of the quantum dots (energy bandgap) can be controlled by controlling an amount of the lattice mismatching between the underlying layer and the quantum dot layer.

An amount of the lattice mismatching can be controlled by the composition of the semiconductor substrate. For example, in the above example, as shown in FIG. 14, if the InGaAs buffer layer 112 formed of InGaAs which has the larger lattice constant than GaAs is provided in place of the GaAs buffer layer and then the composition of the InGaAs buffer layer 112 is controlled appropriately, such amount of the lattice mismatching can be controlled.

An advantage achieved by providing the InGaAs buffer layer 112 is to increase the in-plane lattice constant on the surface of the buffer layer 112. In other words, if the InGaAs buffer layer 112 which has a thickness in excess of a critical film thickness for the strain relaxation is deposited on the GaAs substrate layer 110, relaxation of the strain amount caused by the generation of dislocation can be generated and then the in-plane lattice constant on the surface of the buffer layer 112 is increased correspondingly, as shown in FIG. 14. In contrast, if the GaAs buffer layer 52 is deposited on the GaAs substrate 50, no change in the amount of strain and the lattice constant is caused, as shown in FIG. 13.

Accordingly, the in-plane lattice constant on the surface of the InGaAs buffer layer 112 can be controlled by depositing the InGaAs buffer layer 112, and as a result the emission wavelength of the quantum dots 114 can be controlled. Also, in the structure shown in FIG. 13, it is difficult to control the emission wavelength of the quantum dots 54.

FIG. 15 shows a relationship between the In composition of InGaAs buffer layer and the emission wavelength of the quantum dot in the sample in which the quantum dot layer containing InGaAs quantum dots therein is formed by supplying alternatively InAs and GaAs onto the InGaAs buffer layer at the atomic layer level while using the MOVPE equipment. As illustrated in FIG. 15, it can be found that, since the emission wavelength of the quantum dots can be increased with the increase of In composition of the InGaAs buffer layer, such emission wavelength can be shifted to the longer wavelength side by providing the InGaAs buffer layer rather than the quantum dots in the prior art. Also, the similar result, although not shown, can be achieved if the quantum dots are formed by the normal S-K mode on the InGaAs buffer layer.

Furthermore, the present invention will be explained in detail with reference to the seventh to ninth embodiments hereinafter.

Seventh Embodiment

A semiconductor device and a method of manufacturing the same according to a seventh embodiment of the present invention will be explained with reference to FIGS. 16 and 17A to 17E hereinbelow.

Figure 16:
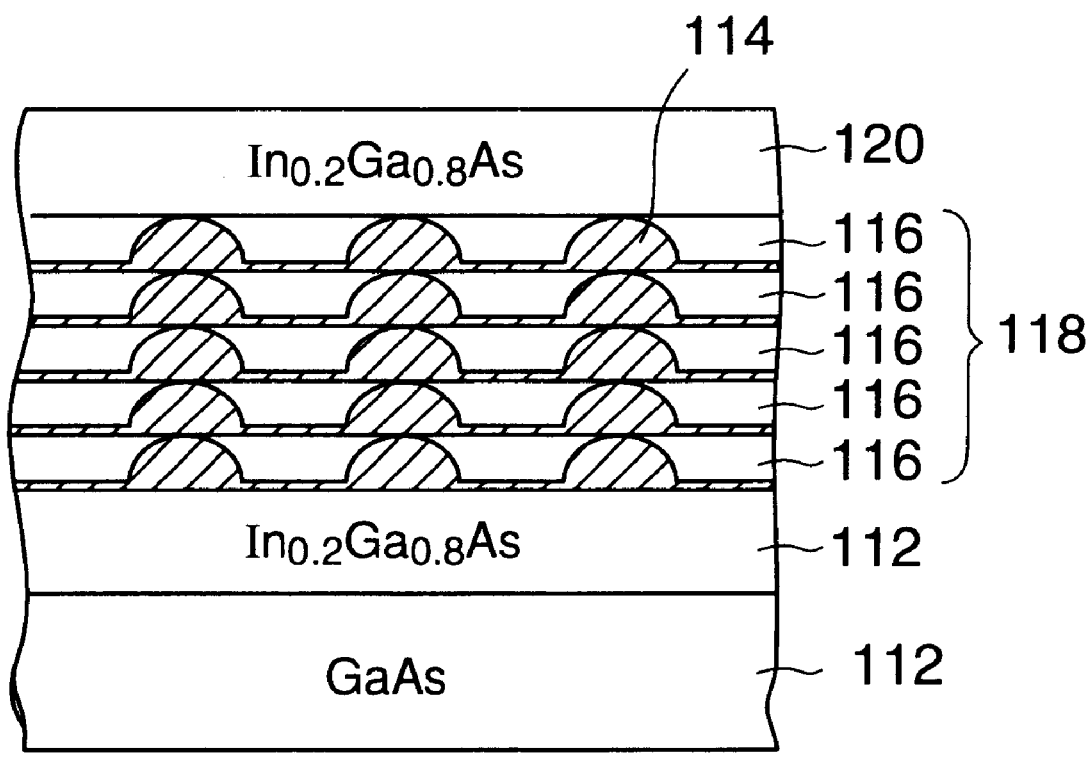
FIG. 16 is a schematic sectional view showing a structure of a semiconductor device according to a seventh embodiment of the present invention.

FIG. 16 is a schematic sectional view showing a structure of a semiconductor device according to the seventh embodiment. FIGS. 17A to 17E are sectional views showing steps of a semiconductor device manufacturing method according to the seventh embodiment.

To begin with, a structure of a semiconductor device according to the seventh embodiment will be explained hereunder.

The buffer layer 112 formed of $In_{0.2}Ga_{0.8}As$ and having an about 500 nm film thickness is formed, on the GaAs substrate 110. A quantum dot layer 118 which is formed by laminating repeatedly the quantum dots 114 formed of InAs and the intermediate layer 116 formed of the GaAs layer is formed on the buffer layer 112. A cladding layer 120 formed of InGaAs is formed on the quantum dot layer 118. In this manner, the quantum dots 114 formed of InAs are formed on the GaAs substrate 110.

As described above, features of the semiconductor device according to the seventh embodiment reside in that the buffer layer 112 being provided between the GaAs substrate 110 and the quantum dot layer 118 is formed of $In_{0.2}Ga_{0.8}As$ which has the lattice constant larger than GaAs and that the lattice constant on the surface of the buffer layer 112 is set larger than that of the GaAs substrate 110. As a result, the emission wavelength of the quantum dots 114 formed on the buffer layer 112 can be shifted to the longer wavelength slide.

When the photoluminescence (PL) of the semiconductor device shown in FIG. 16 is measured at room temperature, the emission wavelength of the quantum dots becomes about 1.3 μm. In contrast, in the sample in which the quantum dots are formed by using the GaAs buffer layer instead of the $In_{0.2}Ga_{0.8}As$ buffer layer, the emission wavelength of the quantum dots becomes about 1.2 μm. As a result, it becomes apparent that the emission wavelength of the quantum dots can be shifted to the longer wavelength side by applying the $In_{0.2}Ga_{0.8}As$ buffer layer in lieu of the GaAs buffer layer.

Next, a semiconductor device manufacturing method according to the seventh embodiment will be explained with reference to FIGS. 17A to 17E hereunder.

Figure 17A:
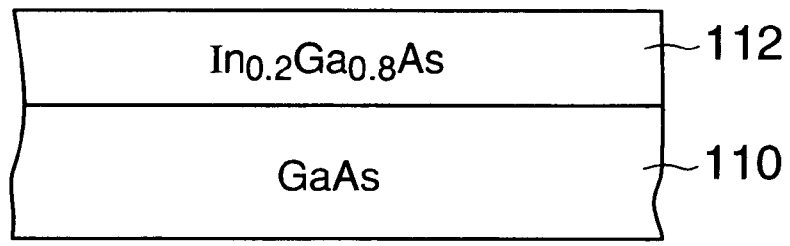
FIGS. 17A to 17E are sectional views showing steps of a semiconductor device manufacturing method according to the seventh embodiment of the present invention.

At first, as shown in FIG. 17A, the buffer layer 112 formed of $In_{0.2}Ga_{0.8}As$ is deposited on the GaAs substrate 10 by the MBE method, for example. The substrate temperature is set to 500° C., for example. It is desired that the buffer layer 112 should have a film thickness enough to differentiate the lattice constant on the surface of the buffer layer 112 from the lattice constant of the GaAs substrate 110, i.e., a film thickness which is in excess of a critical film thickness for the strain relaxation. In the case of the InGaAs having the above composition, for example, the buffer layer 112 whose lattice constant on the surface region is different from that of GaAs can be formed by the film thickness of about 500 nm. It is desired that the film thickness of the buffer layer 112 should be adjusted appropriately according to the composition of the buffer layer 112.

Figure 17B:
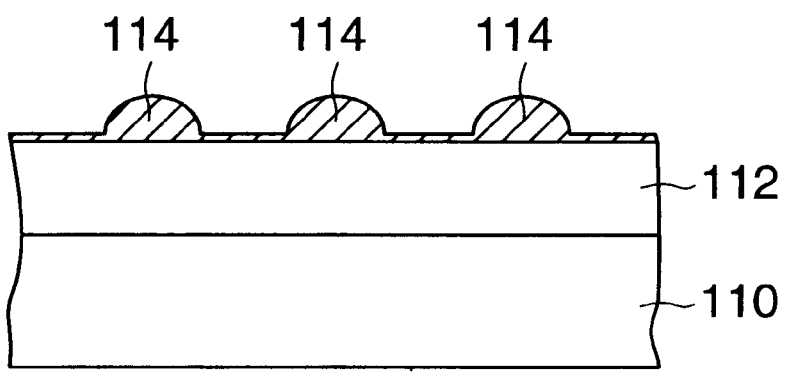

Then, as shown in FIG. 17B, the quantum dots formed of InAs are self-formed in the S-K mode on the buffer layer 112 by the MBE method, for example. For example, InAs equivalent to 1.8 ML (monolayer) is supplied at the growth rate of 0.1 μm/h, the As pressure of $1.2 \times 10^{-5}$ Torr, and the substrate temperature of 650° C., and then supply of such material is interrupted for about one minute to promote its three-dimensional growth. Thus, the quantum dots formed of InAs are formed on the In0.2Ga0.8As buffer layer.

Then, as shown in FIG. 17B, the quantum dots formed in the S-K mode are connected mutually by a thin layer which is called a wet layer. Accordingly, based on whether or not the wet layer is present, it can be decided whether or not the quantum dots have been grown by the S-K mode.

Figure 17C:
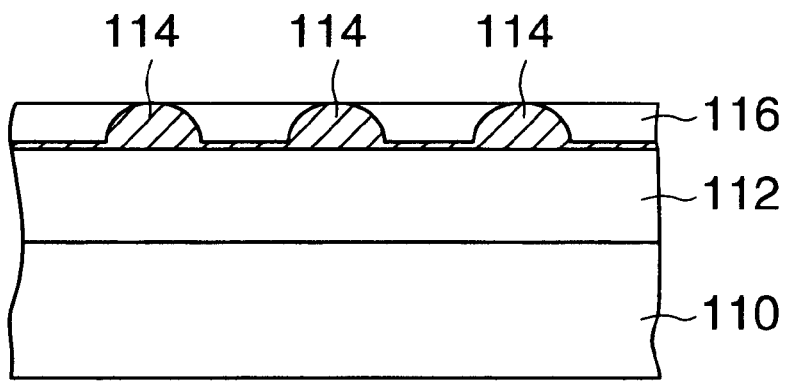

Then, as shown in FIG. 17C, the intermediate layer 116 made of GaAs is formed on the quantum dots 114, which are formed in this way, by the MBE method, for example. For example, GaAs equivalent to 3 ML is supplied at the growth rate of 0.75 μm/h, the As pressure of $6 \times 10^{-6}$ Torr, and the substrate temperature of 510° C., and then supply of such material is interrupted for about two minutes to promote its growth. Thus, the intermediate layer 116 is formed to bury regions between the quantum dots 114.

If a film thickness of the intermediate layer is thinned to such an extent that such film thickness becomes almost smaller than a height of the quantum dot 114, a plurality of quantum dots 114 which are laminated in close proximity in the film forming direction begin to function as one quantum dot. That is, the effective size of the quantum dot 114 can be enlarged. Accordingly, the quantum size effect is weakened and thus the emission wavelength is shifted to the longer wavelength side. As a result, it is possible to shift the emission wavelength to the longer wavelength side by laminating the quantum dots 114 in close proximity.

Figure 17D:
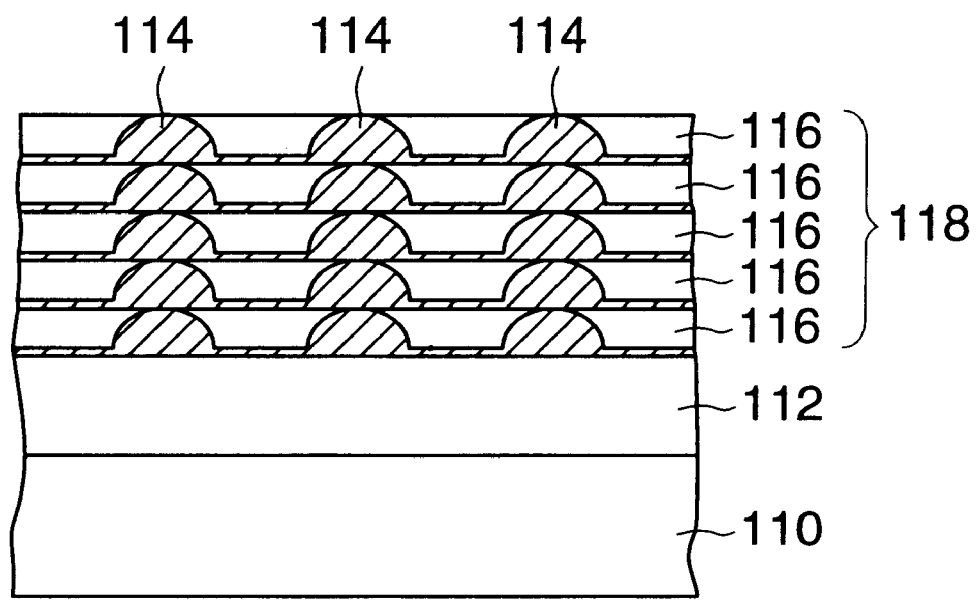

Then, as shown in FIG. 17D, according to similar procedures to the above, InAs equivalent to 0.7 ML and GaAs equivalent to 3 ML are deposited eight times, for example, repeatedly by the MBE method, for example. As a result, a quantum dot layer 118 in which the quantum dots 114 are laminated in close proximity as the multi-layered structure is formed.

Figure 17E:
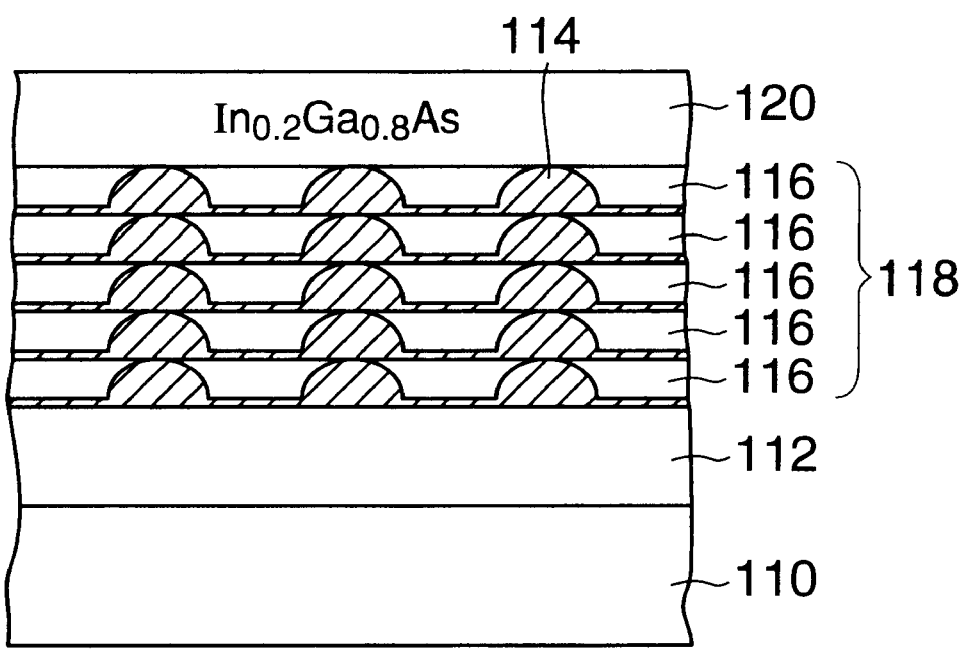

Then, as shown in FIG. 17E, a cladding layer 120 made of InGaAs is formed on the quantum dot layer 118 by the MBE method, for example, to have a film thickness of about 30 nm.

Accordingly, the manufacture of the semiconductor device shown in FIG. 16 can be completed.

In this manner, according to seventh embodiment, since the buffer layer whose lattice constant on the surface side is different from the lattice constant of the substrate is provided between the substrate and the quantum dots, the emission wavelength of the quantum dots can be controlled by controlling composition of the buffer layer. In addition, in the system wherein the InAs or InGaAs quantum dots are formed on the GaAs substrate, the quantum dots having the emission wavelength in excess of 1.3 μm, which is available in the optical communication, can be formed by interposing the InGaAs buffer layer between the substrate and the quantum dots.

Eighth Embodiment

A semiconductor device and a method of manufacturing the same according to an eighth embodiment of the present invention will be explained with reference to FIGS. 18 and 19A to 19C hereinbelow.

Figure 18:
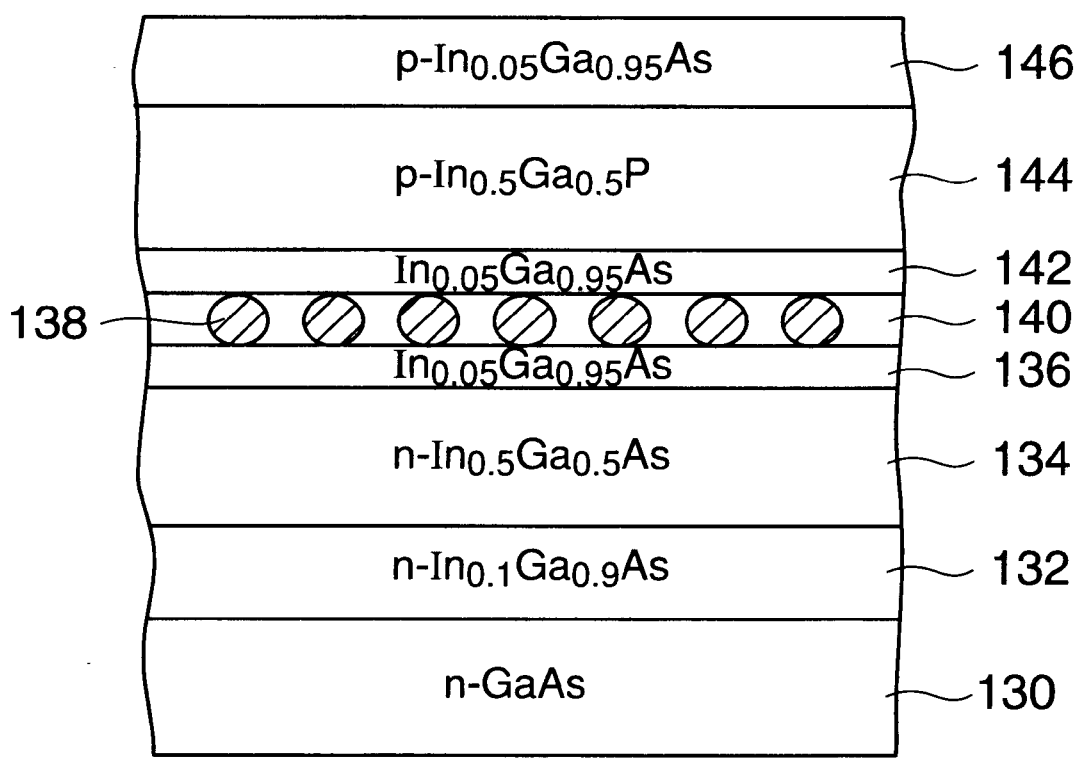
FIG. 18 is a schematic sectional view showing a structure of a semiconductor device according to an eighth embodiment of the present invention.
Figure 19A:
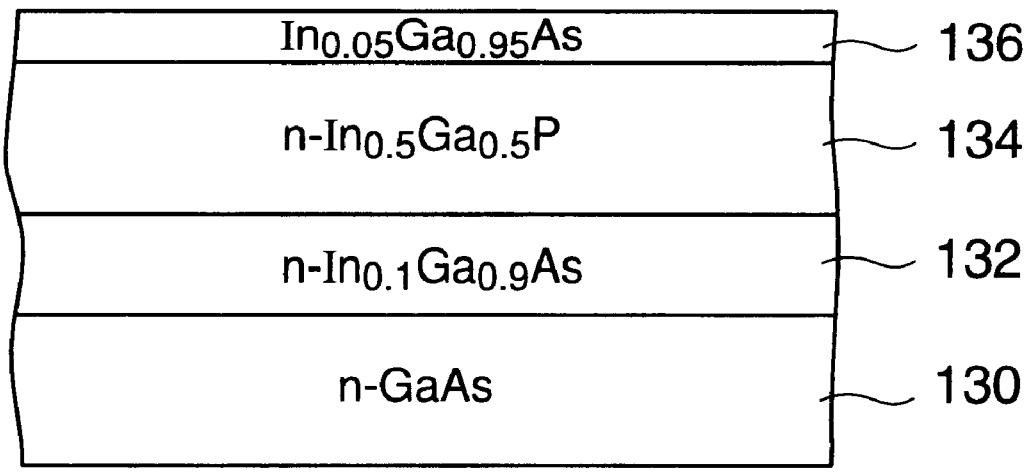
FIGS. 19A to 19C are sectional views showing steps of a semiconductor device manufacturing method according to the eighth embodiment of the present invention.
Figure 19B:
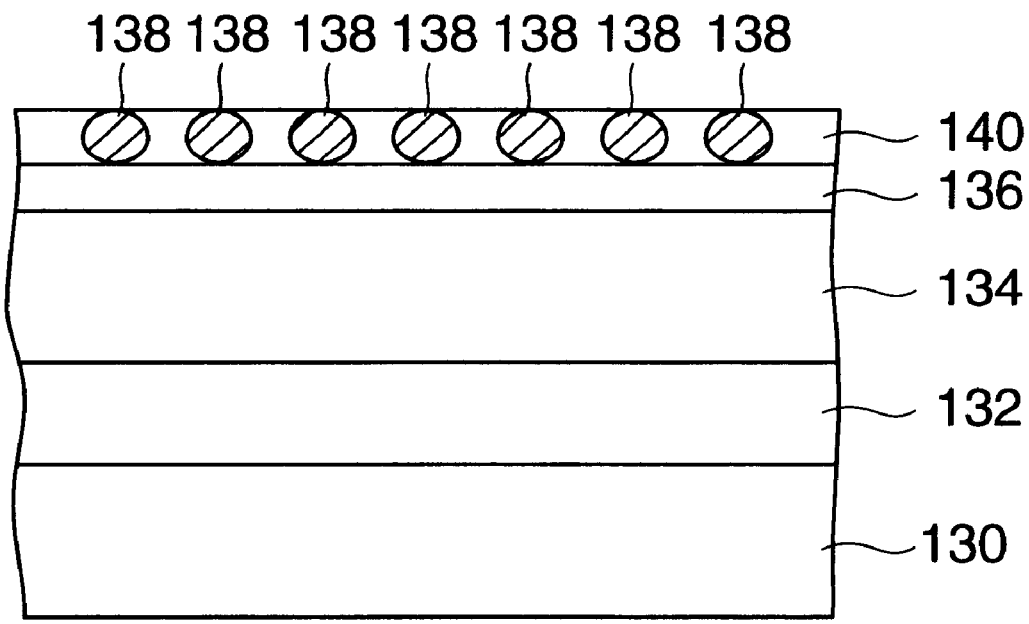
Figure 19C:
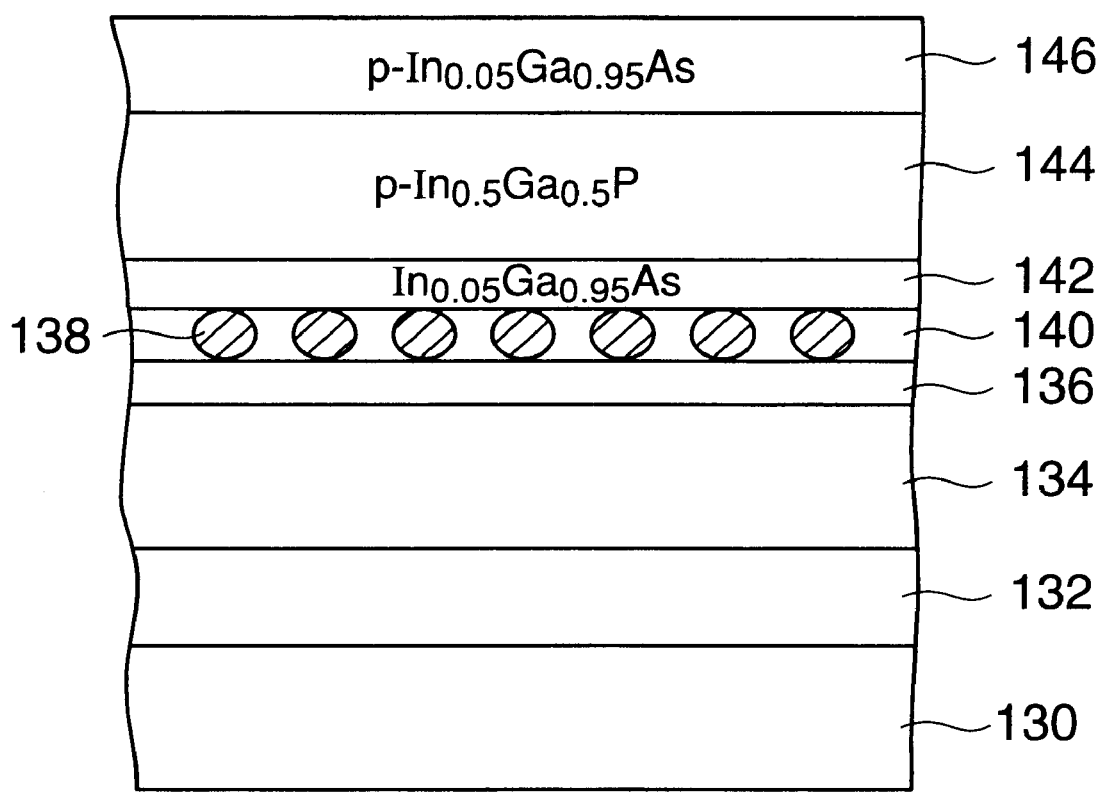

FIG. 18 is a schematic sectional view showing a structure of a semiconductor device according to the eighth embodiment. FIGS. 19A to 19C are sectional views showing steps of a semiconductor device manufacturing method according to the eighth embodiment.

In the eighth embodiment, the case where quantum dots constructed by the present invention are applied to the laser device will be explained hereunder.

To begin with, a structure of a semiconductor device according to the eighth embodiment will be explained with reference to FIG. 18 hereunder.

A buffer layer 132 made of n-$In_{0.1}Ga_{0.9}As$ is formed on an n-GaAs substrate 130 to have a film thickness of about 500 nm. A cladding layer 134 made of n-$In_{0.5}Ga_{0.5}P$ is foraged on the buffer layer 132 to have a film thickness of about 1400 nm. An SCH (Separate Confinement Heterostructure) layer 136 made of $In_{0.05}Ga_{0.95}As$ is formed on the cladding layer 134 to have a film thickness of about 100 nm. An InGaAs active layer 140 containing InGaAs quantum dots 138 is formed on the SCH layer 136. An SCH layer 142 made of $In_{0.05}Ga_{0.95}As$ is formed on the active layer 140 to have a film thickness of about 100 nm. A cladding layer 144 made of p-$In_{0.5}Ga_{0.5}P$ is formed on the SCH layer 142 to have a film thickness of about 1400 nm. A contact layer 146 made of p-$In_{0.05}Ga_{0.95}As$ is formed on the cladding layer. 144 to have a film thickness of 400 nm.

In this fashion, in the semiconductor laser according to the eighth embodiment, since the quantum dot active layer is used as the active layer 140 of the semiconductor laser, efficiency in mutual action between the electron/hole and the light can be increased up to the utmost limits and thus the oscillation threshold current and the temperature characteristic of the threshold current can be improved. The emission wavelength of the quantum dot active layer can be controlled appropriately by controlling a composition ratio of the buffer layer 32 which corresponds to the buffer layer 112 in the first embodiment. That is, the semiconductor laser having the emission wavelength in the 1.3 µm band or the 1.55 µm band, which is suitable for the optical communication, can be achieved by controlling appropriately the composition of the InGaAs layer constituting the buffer layer 132. For example, if the buffer layer 132 is formed of the above $In_{0.1}Ga_{0.9}As$, the in-plane lattice constant is increased larger than the lattice constant of GaAs and thus such resultant lattice constant can be provided to the upper layers. Accordingly, the emission wavelength of the quantum dots can be controlled to 1.3 µm or 1.55 µm by controlling appropriately the In composition of the buffer layer 132.

Next, a semiconductor device manufacturing method according to the eighth embodiment will be explained with reference to FIGS. 19A to 19C hereunder.

First, the n-$In_{0.1}Ga_{0.9}As$ layer of about 500 nm thick, the n-$In_{0.5}Ga_{0.5}P$ layer of about 1400 nm thick, and the $In_{0.05}Ga_{0.95}As$ layer of about 100 nm thick are deposited sequentially on the n-GaAs substrate 130 by the MOVPE method, for example. Trimethylindium (TMI), trimethylindium-dimethylethylamine-adduct (TMIDMEA), and, triethylgallium (TEG) may be employed as group III material, for example, and arsine ($AsH_3$) may be employed as group III material, For example. The substrate temperature in forming the film is set to 500° C., for example. Accordingly, as shown in FIG. 19A, the buffer layer 132 formed of n-$In_{0.1}Ga_{0.9}As$, the cladding layer 134 formed of n-$In_{0.5}Ga_{0.5}P$, and the SCH layer 136 formed of $In_{0.05}Ga_{0.95}As$ are formed on the n-GaAs substrate 130.

Then, the active layer 140 is formed on the SCH layer 136 by the MOVPE method, for example. If the film formation is carried out by supplying alternatively InAs and GaAs at the atomic layer level at the substrate temperature of 500° C., for example, the active layer 140 made of InGaAs is formed to contain the InGaAs quantum dots 138 therein. When the InGaAs film is formed by supplying alternatively InAs and GaAs, InGaA, having high In composition are aggregated in the film to thus form the quantum dots 138. Accordingly, as shown in FIG. 19B, the active layer 140 containing the quantum dots 138 therein is formed on the SCH layer 136.

Then, the $In_{0.05}Ga_{0.95}As$ layer of about 100 nm thick, the p-$In_{0.5}Ga_{0.5}P$ layer of about 1400 nm thick, and the p-$In_{0.05}Ga_{0.95}As$ layer of about 400 nm thick are deposited sequentially on the active layer 140 by the MOVPE method, for example. The substrate temperature in forming the film is set to 500° C., for example. Accordingly, as shown in FIG. 19C, the SCH layer 142 formed of $In_{0.05}Ga_{0.95}As$, the cladding layer 144 formed of p-$In_{0.5}Ga_{0.5}P$, and the contact layer 146 formed of p-$In_{0.05}Ga_{0.95}As$ are formed on the active layer 140.

In this manner, the semiconductor device shown in FIG. 18 can be formed.

According to the eighth embodiment, in the semiconductor laser having the active layer formed of the quantum dot layer, since the emission wavelength of the quantum dots can be controlled by the underlying film constituting the SCH layer, the oscillation threshold current and the temperature characteristic of the threshold current can be improved and also the emission wavelength can be shifted to the longer wavelength side. Accordingly, the semiconductor laser having the emission, wavelength of the 1.3 µm band or the 1.55 µm band, which is fitted for the optical communication, can be constructed.

Ninth Embodiment

The present invention is not limited to the above embodiments and various modifications can be applied.

In the above embodiments, the explanation has been made while taking as examples the case where the InGaAs buffer layer and the InAs or InGaAs quantum dots are formed on the GaAs substrate. However, the present invention may be similarly applied to the other material system semiconductor device. In other words, according to the present invention, in the semiconductor device having the quantum dots which are formed on the semiconductor substrate via the buffer layer, the semiconductor layer which has the lattice constant different from that of the substrate is utilized as the buffer layer and also the emission wavelength of the quantum dots is controlled by controlling the in-plane lattice constant of this semiconductor layer. Therefore, the present invention is not limited to the above-mentioned material system. For example, not only the GaAs semiconductor but also the InP compound semiconductor, the Si or Ge semiconductor, etc, may be similarly applied. Besides, group II–VI or group III–V compound semiconductor such as InAs, InGaAs, and others may be utilized as the semiconductor layer constituting the quantum dots. The material constituting the buffer layer may be selected appropriately form semiconductor materials which have the different lattice (constant from the semiconductor substrate but can be epitaxially grown while relaxing the distortion. Also, as the material constituting the quantum dots, material which enables to self-form the quantum dots on the buffer layer in the S-K mode may be-selected appropriately.

In the above seventh embodiment, the quantum dots are laminated as the multi-layered structure by the closely stacking method. However, the quantum dots are not always formed as the multi-layered structure by the closely stacking method. For example, the single quantum dot layer may be formed by the S-K mode, otherwise the quantum dots may be laminated via the thick intermediate layer as the multi-layered structure.

In the above eighth embodiment, the example in which the quantum dots constructed by the present invention is applied to the active layer of the semiconductor laser is shown. However, the present invention may be similarly applied to various devices utilizing the quantum dots such as the blue chirp modulator, the wavelength converting device, the quantum dot memory, etc.

The above advantages achieved by the present invention do not depend on the quantum dot film forming method, but normally the emission wavelength of the quantum dots may, be changed according to the film forming method. Therefore, it is preferable that the quantum dot film forming method and the film forming conditions should be selected and adjusted appropriately based on the characteristics such as the desired emission wavelength, etc.

Tenth Embodiment

Figure 20:
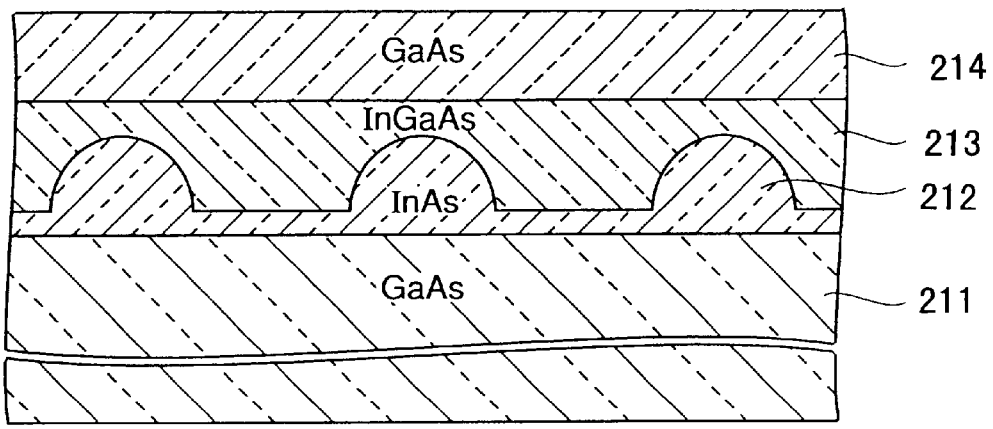
FIG. 20 is a sectional view showing a quantum dot structure device according to a tenth embodiment of the present invention.

FIG. 20 is a sectional view showing a quantum dot structure device according to a tenth embodiment of the present invention.

The quantum dot structure device shown in FIG. 20 is an example of the structure in which quantum dots 212 made of indium arsenide (InAs) are self-formed on a crystal substrate 211 made of gallium arsenide (GaAs).

When materials of indium (In), gallium (Ga), arsenic (As), whose composition is lattice-mismatched with the GaAs crystal substrate 211, are supplied to the GaAs crystal substrate 211, the InAs thin film is formed on the principal surface of the GaAs crystal substrate 211 at the beginning of supply start, but the three-dimensional growth occurs to form the quantum dots 212 after the thin film is grown beyond the elastic limit of the film.

Then, the InAs quantum dots 212 are covered with a strain relaxing layer (first semiconductor crystal layer) 213 formed of indium gallium arsenide (InGaAs), for example. Then, the strain relaxing layer 213 is covered with the GaAs covering layer (second semiconductor crystal layer) 214. Accordingly, the quantum dots 212 are buried in the strain relaxing layer 213, so that the strain relaxing layer 213 is formed on the side portions and the top portion of the quantum dots 212.

The quantum dot structure device shown in FIG. 1 in the prior art does not employ a structure in which the quantum dots 102 are covered with the InGaAs strain relaxing layer, but employs a structure in which the quantum dots 102 are covered with the uniform semiconductor crystal (GaAs) 103 which is identical to the underlying GaAs substrate 101.

Next, the event occurred in the structure of the present invention when the temperature change is caused will be explained hereunder.

In the quantum dot structure device, the temperature change of the quantum dot energy depends on the temperature change of the lattice constant and the energy is reduced when the temperature raises.

Figure 21A:
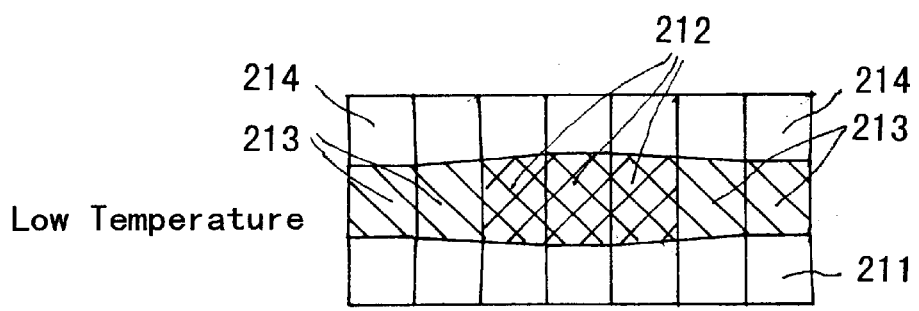
FIGS. 21A and 21B are schematic views showing change in a crystal, lattice of the quantum dot structure device according to the tenth embodiment of the present invention according to temperature change.
Figure 21B:
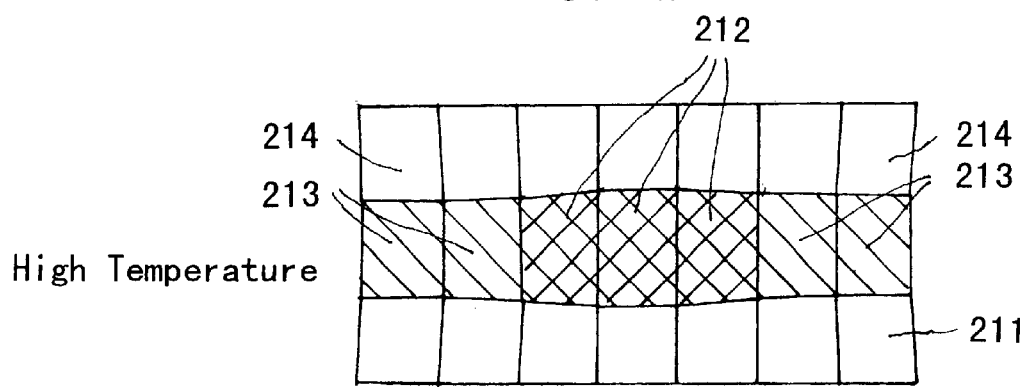

FIGS. 21A and 21B show schematically change in the crystal lattice distortion according to the temperature change in the quantum dot structure device of the present shown in FIG. 20. In contrast, FIGS. 2A and 2B show schematically change in the lattice distortion according to the temperature change between the low temperature state and the high temperature state of the quantum dot in the prior art shown in FIG. 1.

Figure 2A:
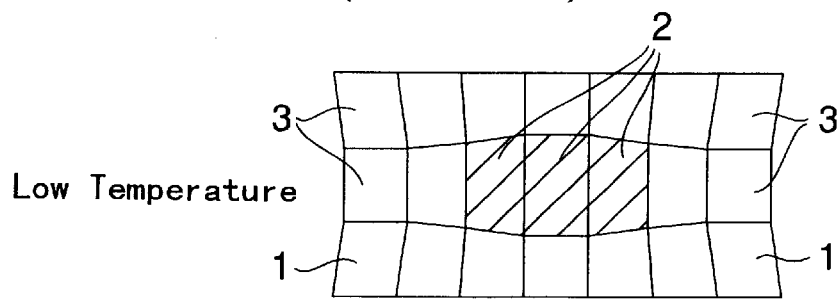
FIGS. 2A and 2B are schematic views showing change in a crystal lattice of the quantum dot structure device in the prior art according to temperature change.
Figure 2B:
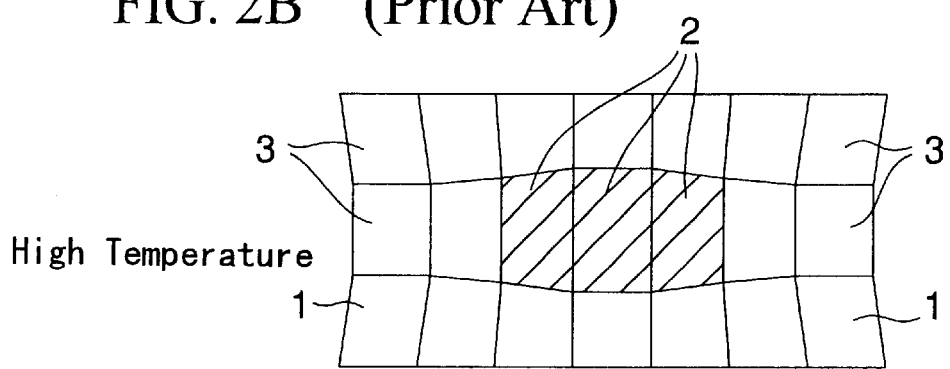

In FIGS. 2A and 2B end FIGS. 21A and 21B, the quantum dot and one crystal lattice constituting the peripheral layer are represented by one block respectively, but the number of the crystal lattices (blocks) is represented smaller than the actual number so as to facilitate the understanding of the change of the crystal lattice distortion of the quantum dot and peripheral crystals.

First, as shown in FIGS. 2A and 2B, in the quantum dot structure at the low temperature state in the prior art, the quantum dots 2 having the large lattice constant are formed while inducing the lattice distortion.

On the contrary, in the present invention, as shown in FIGS. 21A and 21B, since crystals of the strain relaxing layer 213, which has slightly large lattice constant, exist in the lateral direction, an amount of vertical strain applied to the quantum dots 212 becomes smaller than the prior art. In FIGS. 2A and 2B, for easy understanding of the relaxation of the crystal distortion, the strain relaxing layer 213 is depicted only in the lateral direction. In this case, since actually the strain relaxing layer 213 is formed very thin on the quantum dots 212 in light of FIG. 20, an amount of lateral strain can also be reduced actually smaller than the prior art.

By the way, energy change $\Delta E_{total}$ of the quantum dots due to the temperature change can be given by Eq.(1).

Where $\Delta E_{bulk}$ is an amount of energy change as a bulk, $\Delta E_{strain}$ is an amount of energy change due to the lattice distortion, and $\Delta E_{offset}$ is an amount of change in the quantum confinement energy caused when the band offset of the quantum dot and the peripheral crystal is changed.

$$\Delta E_{total} = \Delta E_{bulk} + \Delta E_{strain} + \Delta E_{offset} \quad (1)$$

Then, when the device temperature is increased, $\Delta E_{bulk}$, $\Delta E_{strain}$, and $\Delta E_{offset}$ are changed respectively, so that $\Delta E_{total}$ is changed.

If the device structure shown in FIG. 20 is considered, the lattice constant of InAs constituting the quantum dots 212 is 6.0584 Å and the linear expansion coefficient of InAs caused by the heat is $5.2 \times 10^{-6}$/K. In contrast, the lattice constant of GaAs is 5.6533 Å which is smaller than InAs, but the linear expansion coefficient of GaAs caused by the heat is larger than that of InAs. Therefore, when the temperature is increased, the lattice distortion tends to relax.

Accordingly, in the conventional structure shown in FIG. 1, since the lattice distortion energy is reduced when the temperature of the quantum dot structure raises, $\Delta E_{strain}$ has a minus sign. Also, $\Delta E_{bulk}$ has a minus sign when the temperature raises, and thus the change of the crystal strain accelerates the temperature change of the bulk energy. In other words, in the quantum dent structure device in the prior art, as shown in FIG. 2, the temperature change of the crystal lattice increases difference between the strain relaxation and the contraction of the quantum dots and the peripheral crystal.

In this case, $\Delta E_{offset}$ is a secondary effect caused by $\Delta E_{bulk}$ and has a negligible magnitude.

On the contrary, in the quantum dot structure device according to the tenth embodiment shown in FIG. 20, since the strain relaxing layer 213 formed of InGaAs which has intermediate composition between InAs and GaAs is formed to surround the quantum dots 212, the influence of the crystal distortion upon the natural energy of the quantum dots 212 is small and thus the change in the strain energy is also small when the temperature raises. In the end, as shown in FIGS. 21A and 21B, the change in the total energy can be suppressed rather than the conventional example.

According to the above, a new means for forming the highly uniform quantum dot structure device at high density can be provided and the quantum dot device having high performance can be achieved.

Next, a method of manufacturing the quantum dot structure device according to the tenth embodiment shown in FIG. 20 will be explained in more detail hereunder.

The quantum dots shown in FIG. 20 are formed on the GaAs substrate in the self-forming mode by the MOVPE method. In growing the crystal by the MOVPE method, the substrate temperature is set to 525° C. Then, as the material sources, the group III element is supplied by Trimethlindium (TMI), trimethylindium-dimethyrlethylamine-adduct (TMIDMEA), triethylgallium (TEG), and trimethylgallium (TMG), and the group V material is supplied by arsine ($AsH_3$).

Figure 22A:
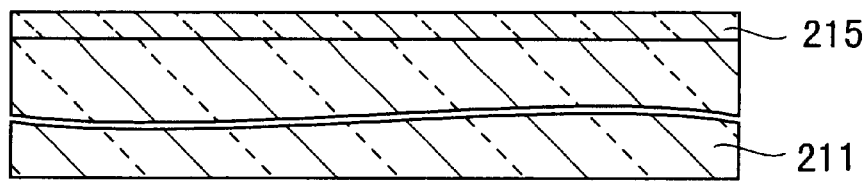
FIGS. 22A to 22D are sectional views showing manufacturing steps of the quantum dot structure device according to the tenth embodiment of the present invention.

First of all, as shown in FIG. 22A, the GaAs buffer layer 215 of 0.5 μm thickness is grown on the principal surface of the GaAs substrate 211 by using TEG and $AsH_3$.

Figure 22B:
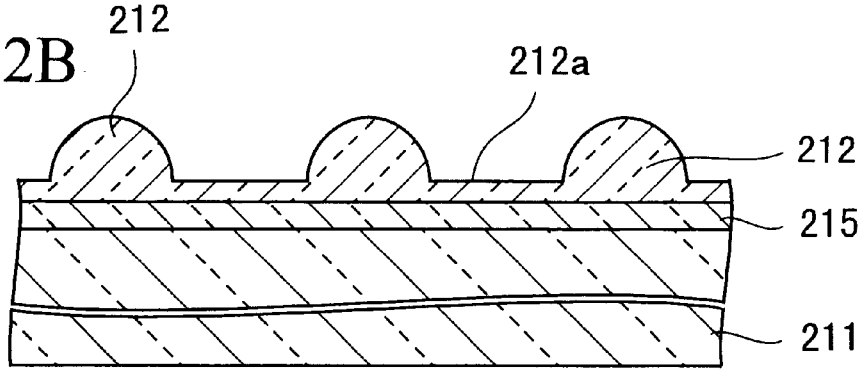

Then, as shown in FIG. 22B, TMIDMEA equivalent to 0.5 ML (mono layer) and TMG, $AsH_3$ equivalent to 0.1 ML are supplied alternatively in 14 cycles onto the buffer layer 215. Accordingly, a large number of quantum dots (three-dimensionally grown islands) 212 which is formed of InAs and has a height of about 10 nm are formed on the upper surface of the buffer layer 215. The InAs layer 212a which has a thickness smaller than the height of the quantum dots is formed around the quantum dots 212.

Figure 22C:
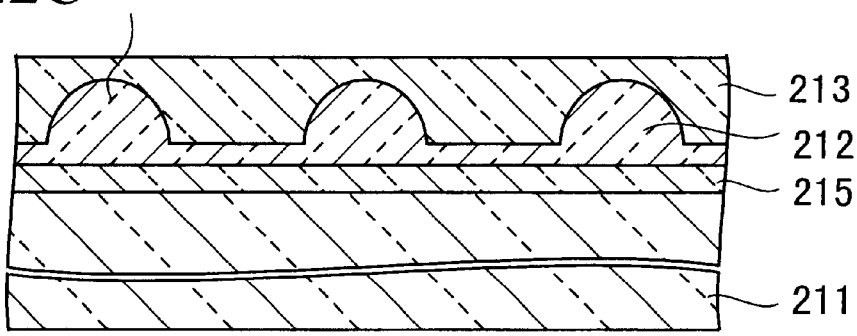

In turn, gasified TMI, TEG, and AsH$_3$ are supplied onto surfaces of the InAs layer 212a and the quantum dots 212. Accordingly, as shown in FIG. 22C, the strain relaxing layer 213 formed of In$_{0.3}$Ga$_{0.7}$As is formed on the InAs layer 212a and the quantum dots 212 to have a thickness of 10 nm, so that the quantum dots 212 are buried by the strain relaxing layer 213. That is, upper portions and side portions of the quantum dots 212 are covered with the In$_{0.3}$Ga$_{0.7}$As strain relaxing layer 213.

Figure 22D:
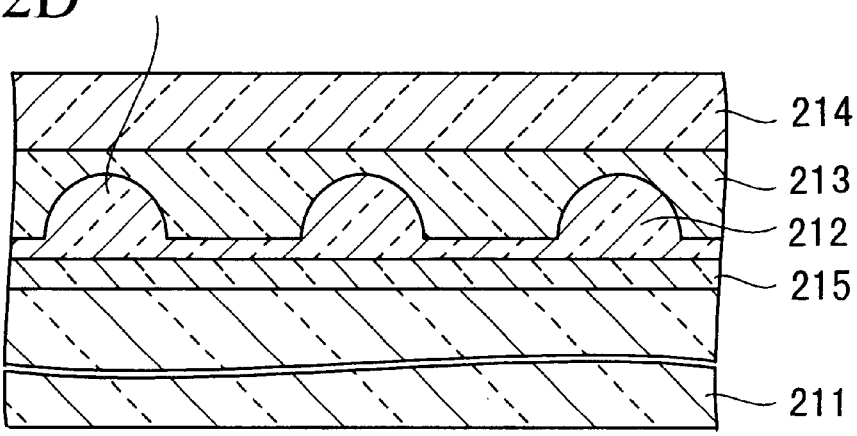

Then, as shown in FIG. 22D, the GaAs covering layer 214 of 30 nm thickness is formed on the In$_{0.3}$Ga$_{0.7}$As strain relaxing layer 213 by supplying the gasified TEG and AsH$_3$ onto the In$_{0.3}$Ga$_{0.7}$As layer.

Figure 23:
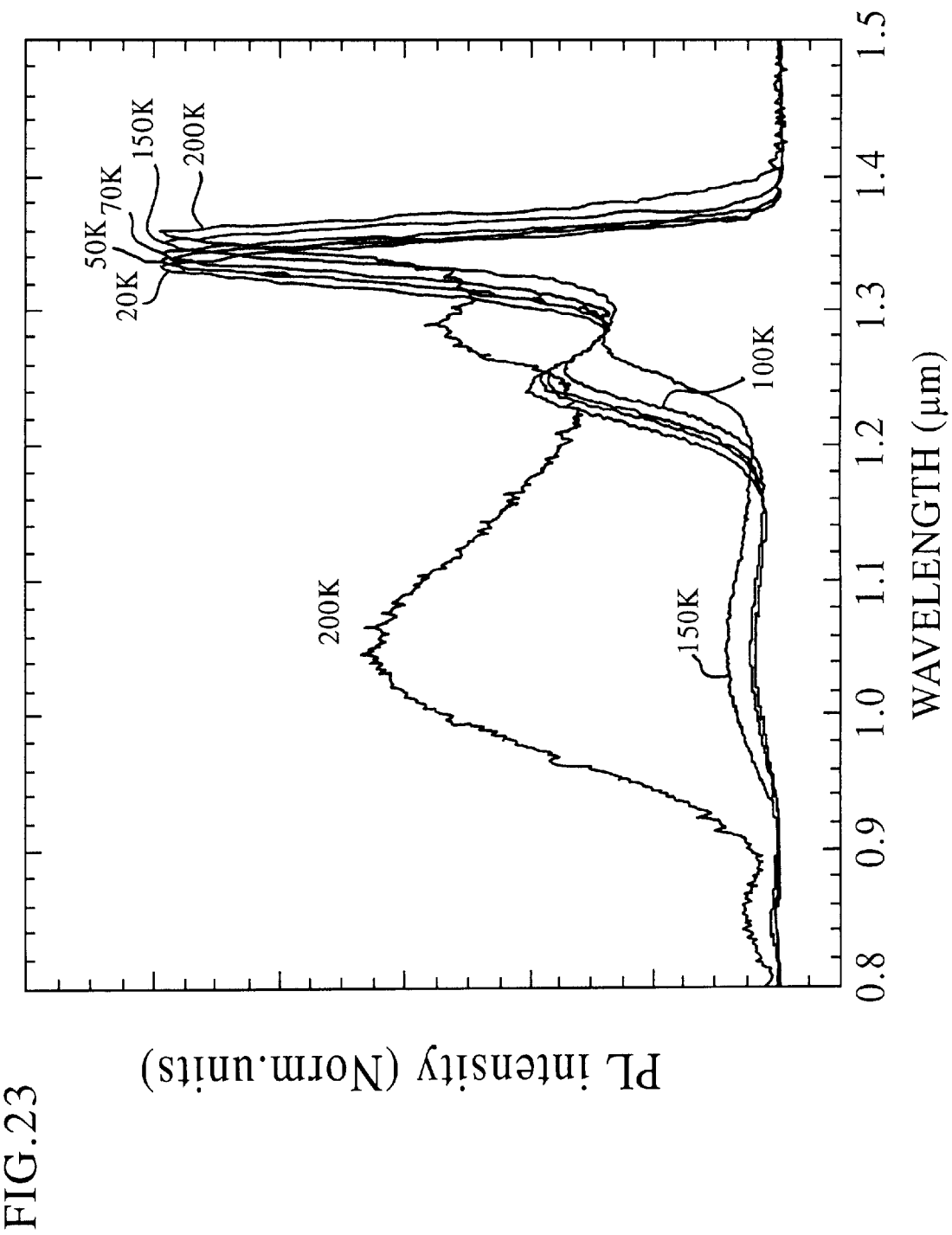
FIG. 23 is a view showing a photoluminescence spectrum of the quantum dot structure device according to the tenth embodiment of the present invention in a temperature range of 20 to 200 K.

FIG. 23 shows a photoluminescence (PL) spectrum of the sample in a temperature range of 20 to 200 K. The sample has the quantum dot structure device shown in FIG. 22D according to the tenth embodiment of the present invention.

In FIG. 23, the photoluminescence intensity (PL energy) is normalized. The photoluminescence peak located in the vicinity of 1.35 μm as the longest wavelength shows the emission from the ground level of the quantum dots. The position of the photoluminescence peak seldom changes over the temperature difference of 180 K.

Figure 24:
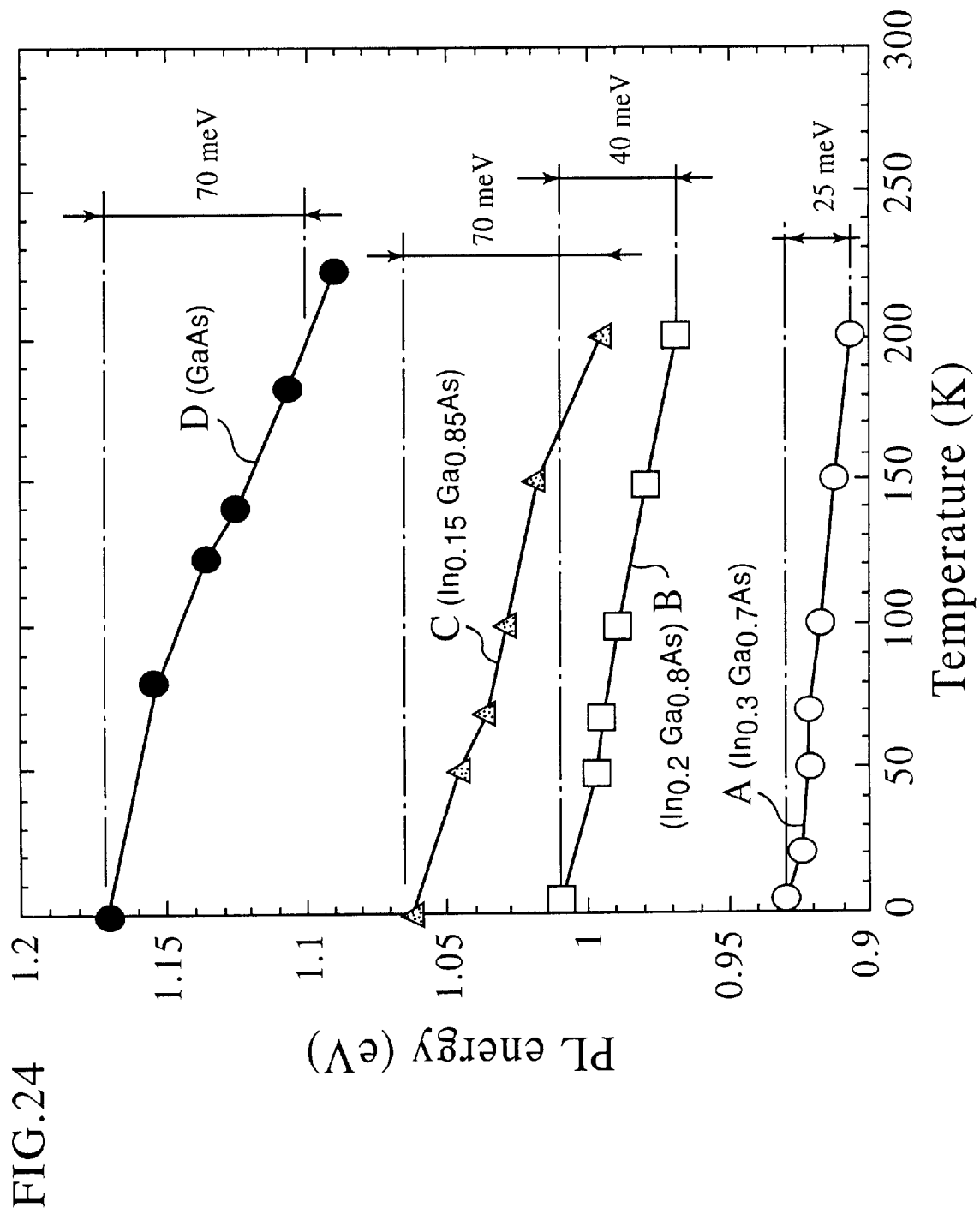
FIG. 24 is a view showing a relationship between a temperature and a PL energy of the quantum dot structure devices in the present invention and the prior art.

FIG. 24 shows compared results of a relationship between the temperature and the PL energy of the quantum dot structure devices. The devices are formed under several conditions where the PL energy is changed relative to the temperature.

In FIG. 24, a sample A shows the device in which the quantum dots are buried by In$_{0.3}$Ga$_{0.7}$As, a sample B shows the device which has the same structure as the sample A and in which the quantum dots are buried by In$_{0.2}$Ga$_{0.8}$As, a sample C shows the device which has the almost same structure as the sample A and in which the quantum dots are buried by In$_{0.15}$Ga$_{0.85}$As, and a sample D shows the device in which the quantum dots are buried by GaAs which are formed by supplying simultaneously growth materials. That is, the samples A to C have the quantum dot structure device shown in FIG. 20 according to the present invention, and the sample D has substantially the quantum dot structure device shown in FIG.1.in the prior art.

It can be understood from FIG. 24 that, if the quantum dots are buried by the material in which a composition ratio x of indium gallium arsenide In$_x$Ga$_{1-x}$is more than 0.2, the energy change relative to the temperature change can be extremely suppressed.

Also, a difference between respective PL energies at 0 K and 200 K are almost equal in the samples C and D, but a difference between respective PL energies at 50 K and 200 K is smaller in the sample C.

The In$_{0.15}$Ga$_{0.85}$As has the natural lattice constant which is larger by about 1.4% than GaAs. Therefore, according to FIG. 24, it is preferable that the lattice constant of the strain relaxing layer 213 should be set larger than the lattice constant of the covering layer 214 by 1.4% or more.

Based on the principle of the present invention, since the quantum dots have the three-dimensional structure, an amount of strain can be controlled individually in the directions of the vertical and lateral crystal axes. This property can be satisfied by any quantum dots other than the InGaAs crystal self-formed quantum dots as illustrated above, and thus the present invention is not limited by the material constituting the quantum dots and the, manufacturing method.

For example, if the GaAs substrate and the indium phosphorus (InP) substrate are employed, crystal materials of the quantum dots and the strain relaxing layer covering them are selected as shown in Table 1. Also, if the silicon carbide (SiC) substrate, the sapphire substrate, and the gallium nitride (GaN) substrate are employed, crystal materials of the quantum dots and the strain relaxing layer covering them are selected as shown in Table 2. Further, if the silicon (Si) substrate is employed, crystal materials of the quantum dots and the strain relaxing layer covering them are selected as shown in Table 3.

Figure 25:
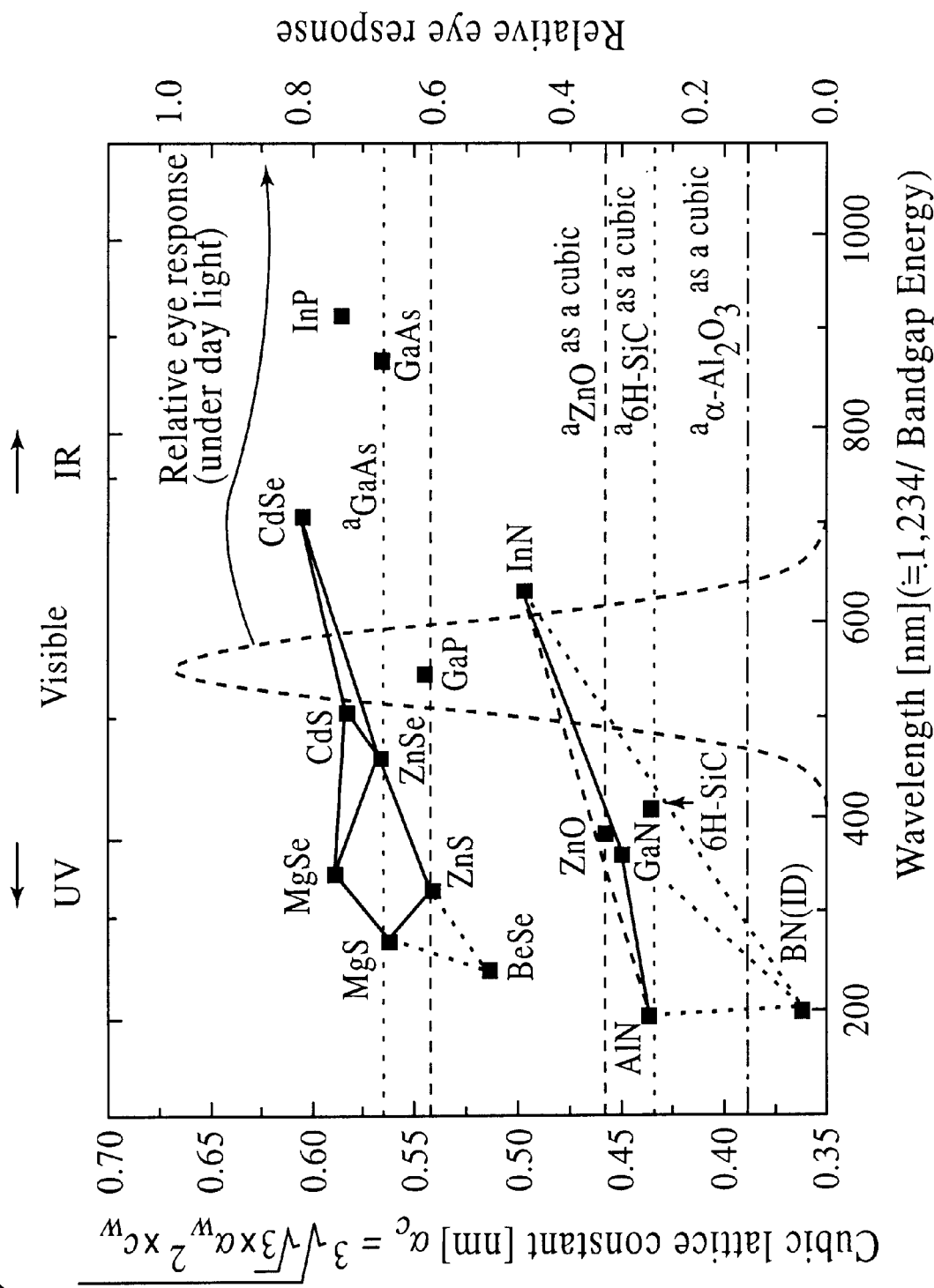
FIG. 25 is a first view showing a relationship between a bandgap (wavelength) and a lattice constant.
Figure 26:
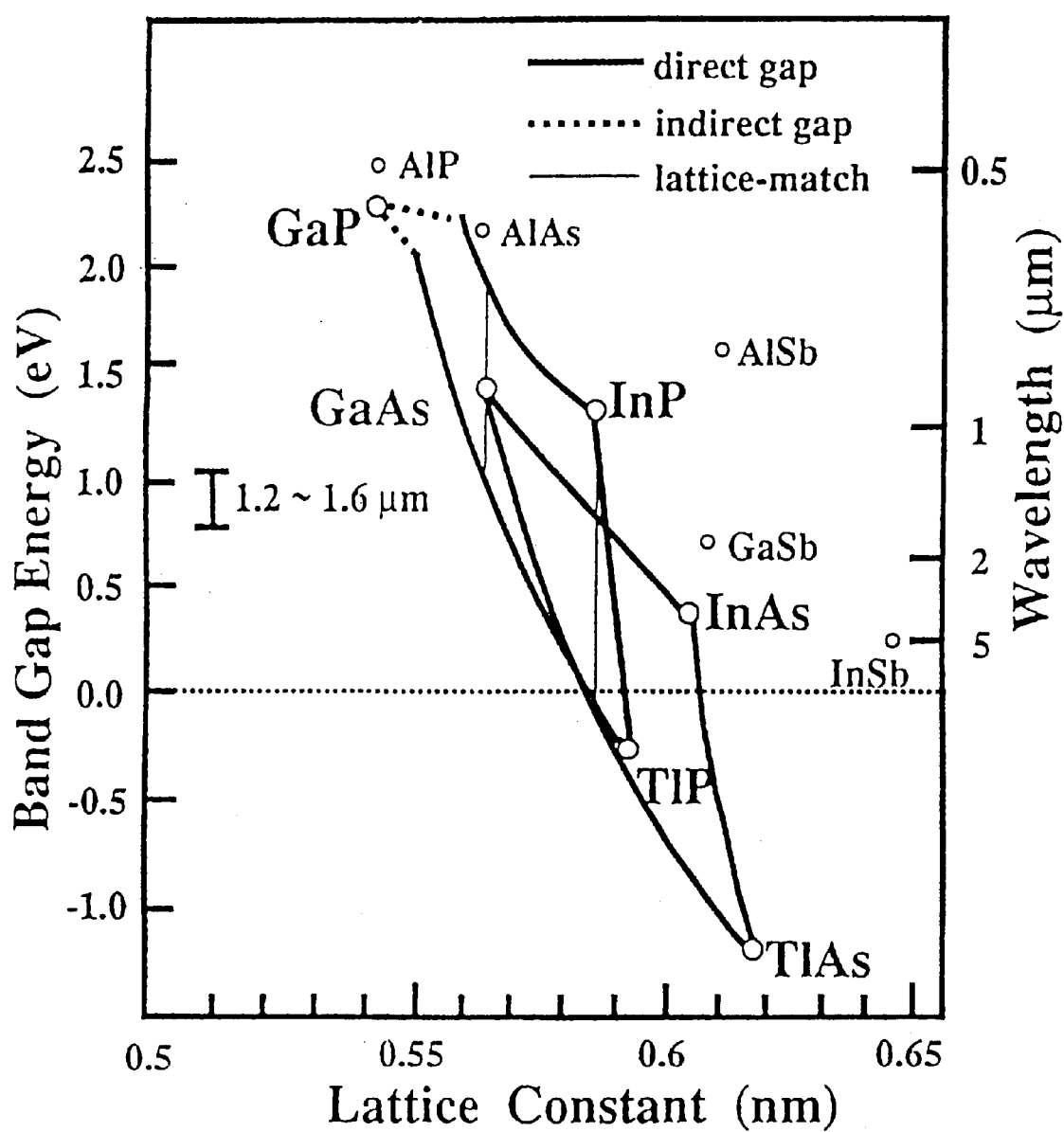
FIG. 26 is a second view showing the relationship between the bandgap and the lattice constant.

In this case, there are many combinations of the quantum dots and the strain relaxing layer covering them, and the relationships between the lattice constant of material and the bandgap shown in FIGS. 25 and 26 are known.

TABLE 1

GaAs substrate, InP substrate

| Dot constituting material | Dot covering crystal material |
| --- | --- |
| Group III–V semiconductor | In$_x$Ga$_y$Al$_{1-x-y}$As$_u$P$_v$Sb$_{1-u-v}$ <br> $0 \leq x \leq 1, 0 \leq y \leq 1, 0 \leq x + y \leq 1$ <br> $0 \leq u \leq 1, 0 \leq v \leq 1, 0 \leq u + v \leq 1$ |
| Thallium group | In$_x$Ga$_y$Al$_z$Tl$_{1-x-y-z}$As$_u$P$_v$Sb$_{1-u-v}$ <br> $0 \leq x, y, z \leq 1, 0 \leq x + y + z \leq 1$ <br> $0 \leq u, v \leq 1, 0 \leq u + v \leq 1$ |
| Group II–IV semiconductor | Zn$_x$Gd$_y$Mn$_z$Be$_{1-x-y}$S$_u$Se$_{1-u}$ <br> $0 \leq x, y, z \leq 1, 0 \leq x + y + z \leq 1$ <br> $0 \leq u \leq 1$ |

In Table 1, if the quantum dots 212 is formed of the group III–V element such as In$_y$Ga$^{1-y}$As (0<y≦1) and the strain relaxing layer 213 and the covering layer 214 is formed of the group III–V element such as In$_x$Ga$_{1-x}$As (0<x≦1), for example, it is preferable that the composition ratio x of the strain relaxing layer 213 should be set larger than that of the covering layer 214 by 0.2 or more.

TABLE 2

SiC substrate, Sapphire substrate, GaN substrate

| Dot constituting material | Dot covering crystal material |
| --- | --- |
| Nitride group | In$_x$Ga$_y$Al$_z$B$_{1-x-y}$N <br> $0 \leq x, y, z \leq 1$ <br> $0 \leq x + y + z \leq 1$ |

TABLE 3

Si substrate

| Dot constituting material | Dot covering crystal material |
| --- | --- |
| SiGe group | Si$_x$Ge$_{1-x}$ <br> $0 \leq x \leq 1$ |

The quantum dot formation is not limited to the above methods. For example, the quantum dots may be formed on an inclined surface (off surface) of the compound semiconductor substrate. In this case, the above strain relaxing layer is formed along the inclined surface.

As described above, according to the tenth embodiment of the present invention, the lattice distortion of the quantum dots and the second semiconductor crystal layer covering them are relaxed by covering a part of the quantum dots with the first semiconductor crystal layer. Therefore, the influence of the lattice distortion upon the nature energy of the quantum dots can be reduced, and also an amount of change in the lattice distortion energy of the quantum dots because of the temperature change can be reduced. As a result, an amount of change in the total energy of the quantum dots can be suppressed rather than the prior art.

What is claimed is:

1. A semiconductor device comprising:
    a compound semiconductor substrate containing at least three elements; and
    quantum dots formed on the compound semiconductor substrate such that their emission wavelength can be defined by a lattice constant of the compound semiconductor substrate.

2. A semiconductor device according to claim 1, wherein the quantum dots are laminated in plural to put an intermediate layer between them.

3. A semiconductor device according to claim 1, wherein the quantum dots are formed of three-dimensionally grown islands which are self-formed in an S-K mode.

4. A semiconductor device according to claim 3, wherein the quantum dots are laminated in plural to put an intermediate layer between them.

5. A semiconductor device according to claim 4, wherein a film thickness of the intermediate layer is set thinner than a height of the quantum dots.

6. A semiconductor device according to claim 1, wherein the compound semiconductor substrate is an InGaAs substrate.

7. A semiconductor device according to claim 1, wherein the quantum dots are formed of InAs or InGaAs.

8. A semiconductor device according to claim 1, further comprising:
    a buffer layer formed between the compound semiconductor substrate and the quantum dots.

9. A semiconductor device according to claim 1, wherein the quantum dots are an active layer of a semiconductor laser.

10. A semiconductor device comprising:
    a semiconductor substrate;
    a buffer layer containing at least three elements formed on the semiconductor substrate having a film thickness enough which is in excess of a critical film thickness for strain relaxation such that its in-plane lattice constant in vicinity of a surface is different from a lattice constant in vicinity of an interface between the semiconductor substrate and the buffer layer; and
    quantum dots formed on the buffer layer such that their emission wavelength can be defined. by controlling the thickness of the buffer layer.

11. A semiconductor device according to claim 10, wherein an emission wavelength of the quantum dots is defined by the lattice constant in vicinity of the surface of the buffer layer.

12. A semiconductor device according to claim 10, wherein the lattice constant in vicinity of the surface of the buffer layer is larger than the lattice constant in vicinity of the interface between the semiconductor substrate and the buffer layer.

13. A semiconductor device according to claim 10, wherein the quantum dots are formed of three-dimensionally grown islands which are self-formed in an S-K mode.

14. A semiconductor device according to claim 10, wherein the quantum dots are laminated in plural to put an intermediate layer between them.

15. A semiconductor device according to claim 14, wherein a film thickness of the intermediate layer is set thinner than a height of the quantum dots.

16. A semiconductor device according to claim 10, wherein the quantum dots are formed of InAs or InGaAs.

17. A semiconductor device according to claim 10, wherein the semiconductor substrate is formed of a GaAs substrate, and the quantum dots are formed of an InGaAs layer.

18. A semiconductor device according to claim 10, wherein the quantum dots are an active layer of a semiconductor laser.

19. A device with quantum dots comprising:
    quantum dots formed of semiconductor which is formed on a surface of a substrate and has a first lattice constant;
    a first semiconductor crystal layer which has a second lattice constant which is different from the first lattice constant and covers the quantum dots from a first direction; and
    a second semiconductor crystal layer which has a third lattice constant which is different from the second lattice constant and covers the quantum dots and the first semiconductor crystal layer from a second direction perpendicular to the first direction;
    wherein the first semiconductor crystal layer is formed between the substrate and the second semiconductor crystal layer to relax a strain of the second semiconductor crystal layer to quantum dots.

20. A device with quantum dots according to claim 19, wherein the first direction is parallel with the surface of the substrate.

21. A device with quantum dots according to claim 19, wherein the quantum dots are crystal-lite which are generated due to lattice distortion relative to the substrate.

22. A device with quantum dots according to claim 19, wherein the second lattice constant of the first semiconductor crystal layer is set larger than the third lattice constant of the second semiconductor crystal layer.

23. A device with quantum dots according to claim 22, wherein the second lattice constant of the first semiconductor crystal layer is set larger than the third lattice constant of the second semiconductor crystal layer by more than 1.4%.

24. A device with quantum dots according to claim 19, wherein the quantum dots are formed of group III–V semiconductor or group II–IV semiconductor.

25. A device with quantum dots according to claim 24, wherein the group III–V semiconductor is $In_xGa_{1-x}As$ ($0<x\leq 1$).

26. A device with quantum dots according to claim 19, wherein at least one of the first semiconductor crystal layer and the second semiconductor crystal layer is formed of group III–V semiconductor.

27. A device with quantum dots according to claim 23, wherein the group III–V semiconductor is $In_xGa_{1-x}As$ ($0\leq x<1$).

28. A device with quantum dots according to claim 26, wherein the group III–V semiconductor constituting the first semiconductor crystal layer or the second semiconductor crystal layer is $In_xGa_{1-x}As$ ($0\leq x<1$), and an indium composition ratio x of the $In_xGa_{1-x}As$ constituting the first semiconductor crystal layer is larger than that of the second semiconductor crystal layer by more than 0.2.

29. A semiconductor device, comprising:
    a compound semiconductor containing at least three elements; and
    quantum dots formed on the compound semiconductor substrate such that their emission wavelength can be defined by controlling a composition ratio of any element of the elements of the compound semiconductor substrate.

30. A semiconductor device according to claim 29:
    wherein the compound semiconductor substrate is InGaAs and wherein the element that is controlled is In.

* * * * *